(12) United States Patent
Kachi et al.

(10) Patent No.: US 7,679,136 B2
(45) Date of Patent: Mar. 16, 2010

(54) SEMICONDUCTOR DEVICE AND MANUFACTURING METHOD OF THE SAME

(75) Inventors: Tsuyoshi Kachi, Takasaki (JP); Yoshinori Hoshino, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/334,446

(22) Filed: Jan. 19, 2006

(65) Prior Publication Data

US 2006/0157779 A1 Jul. 20, 2006

(30) Foreign Application Priority Data

Jan. 20, 2005 (JP) ............................. 2005-012236

(51) Int. Cl.
*H01L 23/62* (2006.01)
(52) U.S. Cl. ........................ 257/330; 257/331; 257/332; 257/333; 257/334
(58) Field of Classification Search .......... 257/330–334
See application file for complete search history.

(56) References Cited

U.S. PATENT DOCUMENTS 5,998,833 A * 12/1999 Baliga ......................... 257/329
2002/0030237 A1 * 3/2002 Omura et al. ................ 257/397

FOREIGN PATENT DOCUMENTS

| JP | 11-354794 | 12/1999 |
|---|---|---|
| JP | 2000-196075 | 7/2000 |
| JP | 2002-083963 | 3/2002 |
| JP | 2003-092405 | 3/2003 |
| WO | WO-97/47045 | 12/1997 |

* cited by examiner

*Primary Examiner*—Bradley K Smith
*Assistant Examiner*—Alexander Belousov
(74) *Attorney, Agent, or Firm*—Antonelli, Terry, Stout & Kraus, LLP.

(57) ABSTRACT

The on-resistance of a semiconductor device having a power transistor with a trench gate structure is reduced. A power MIS-FET with a trench gate structure is so formed that the relation expressed as $0 \leq b \leq a$ holds, where a is the distance between an end of an interlayer insulating layer over the upper face of a semiconductor region for source and the end (position on the periphery of a trench) of the upper face of the semiconductor region for source farther from the gate electrode; and b is the length of the overlap between the interlayer insulating layer and the upper face of the semiconductor region for source. (b is the distance between the position of the end of the interlayer insulating layer over the upper face of the semiconductor region for source and position on the periphery of a trench). As a result, the area of contact between source pads and the semiconductor regions for source is increased, and further the distance between the source pads and a channel forming region can be shortened. Therefore, the on-resistance of the power MIS-FET with a trench gate structure can be reduced.

16 Claims, 34 Drawing Sheets

FIG. 20
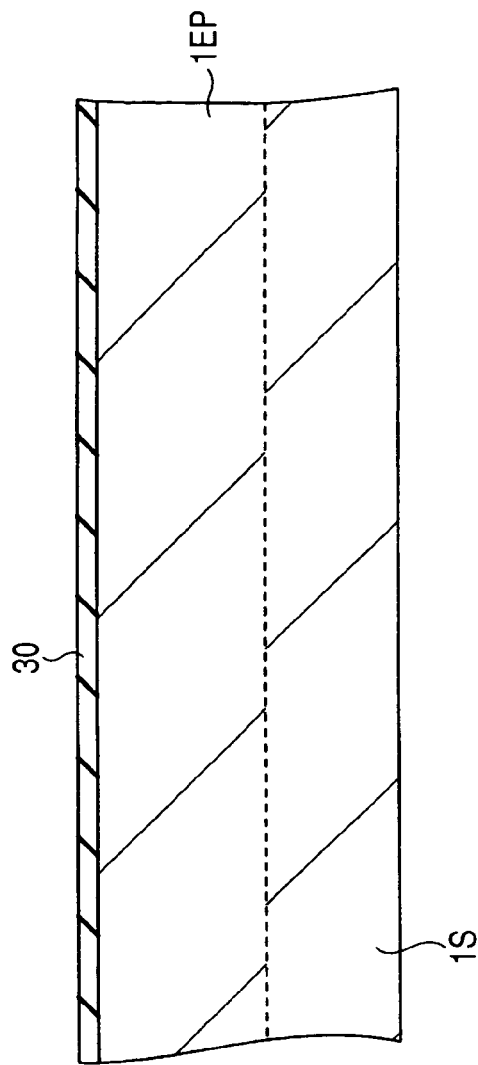
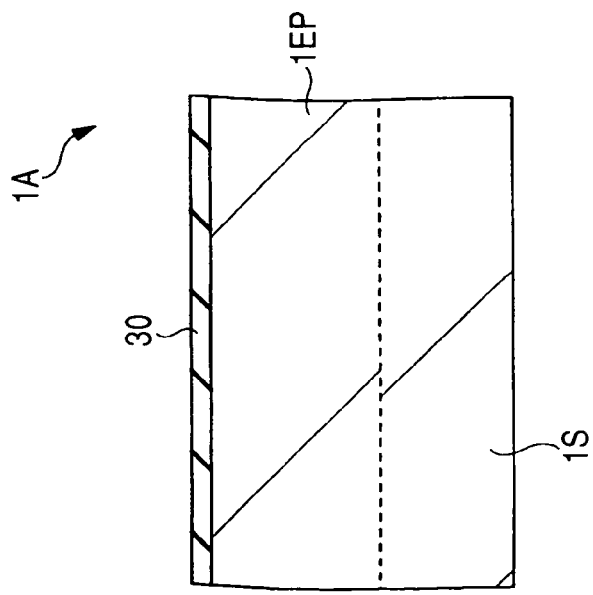

FIG. 21
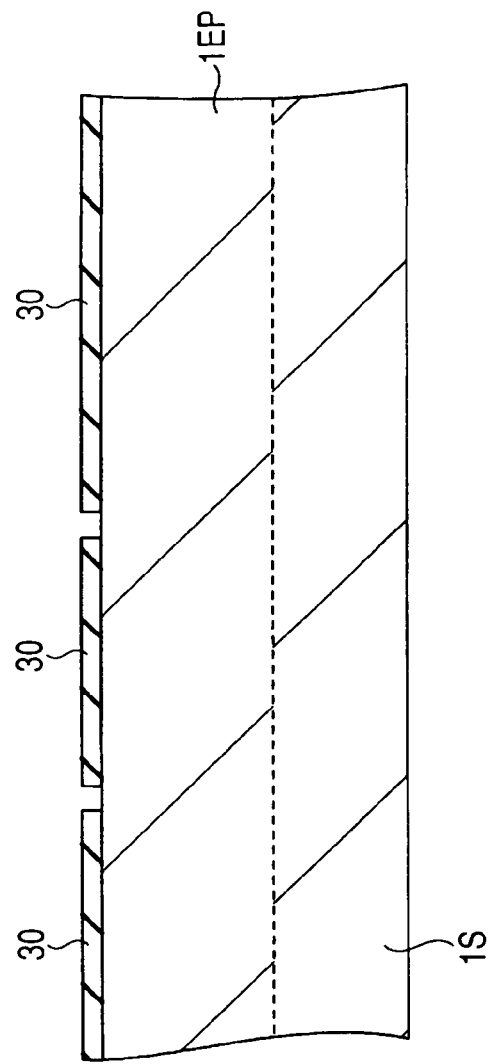
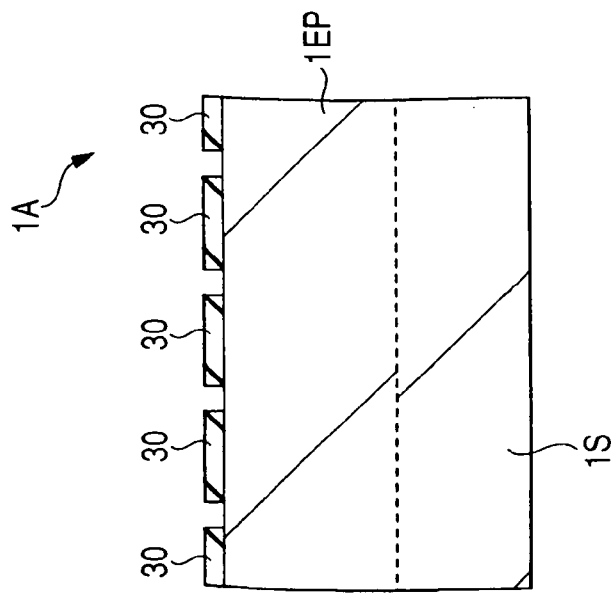

FIG. 22
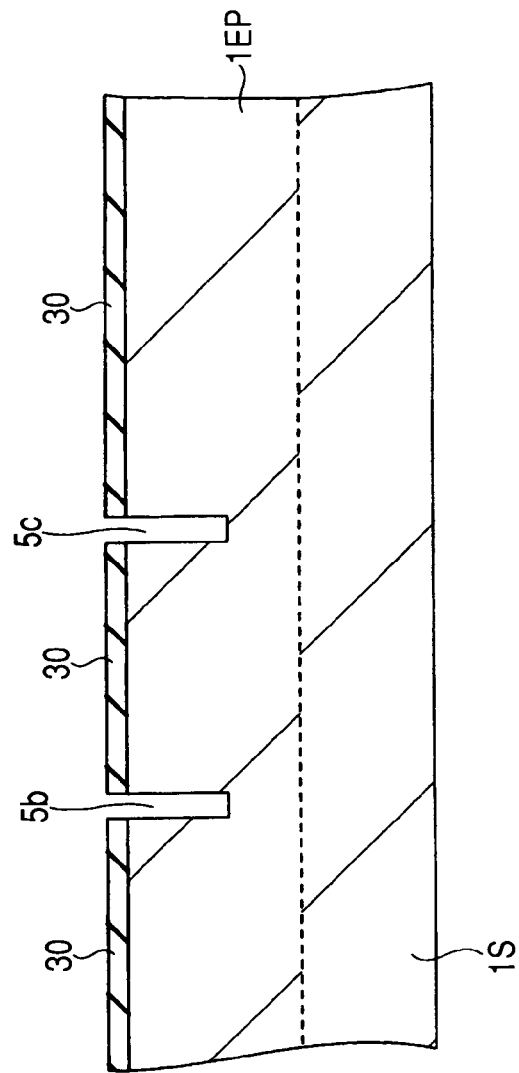
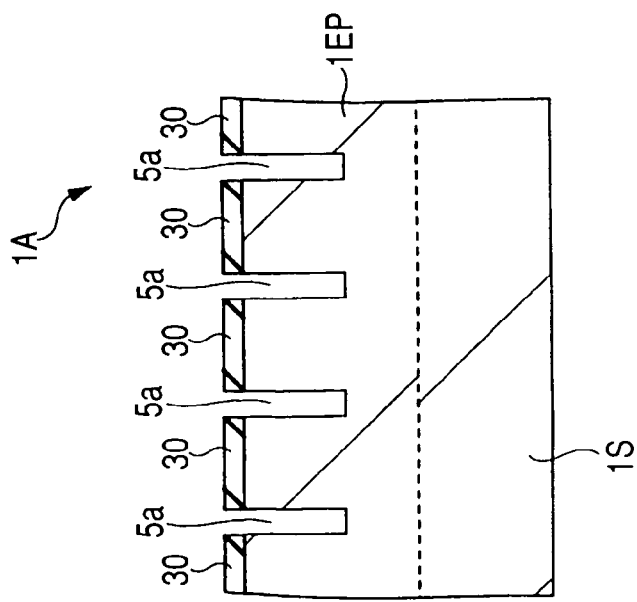

FIG. 23
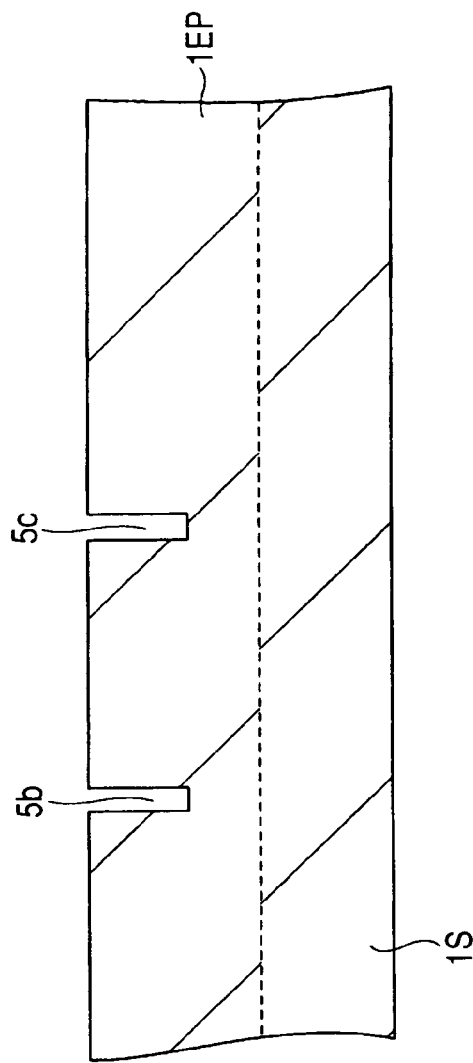
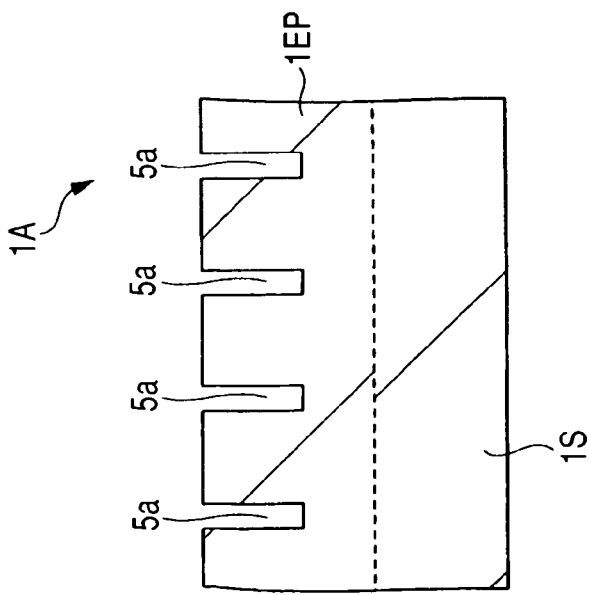

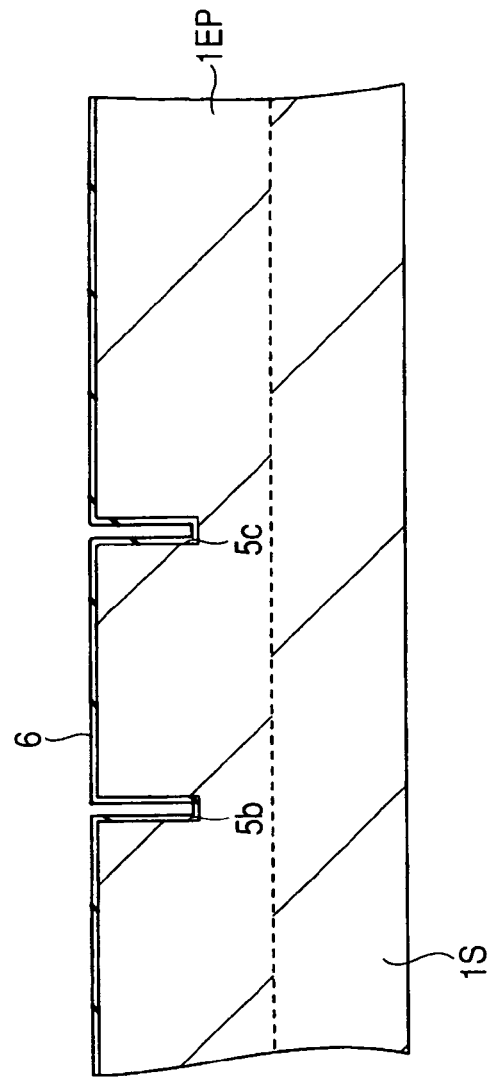
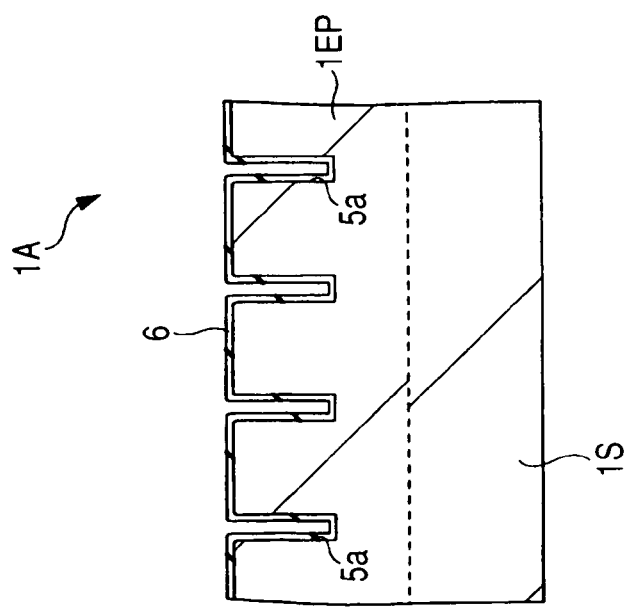
FIG. 24

FIG. 25
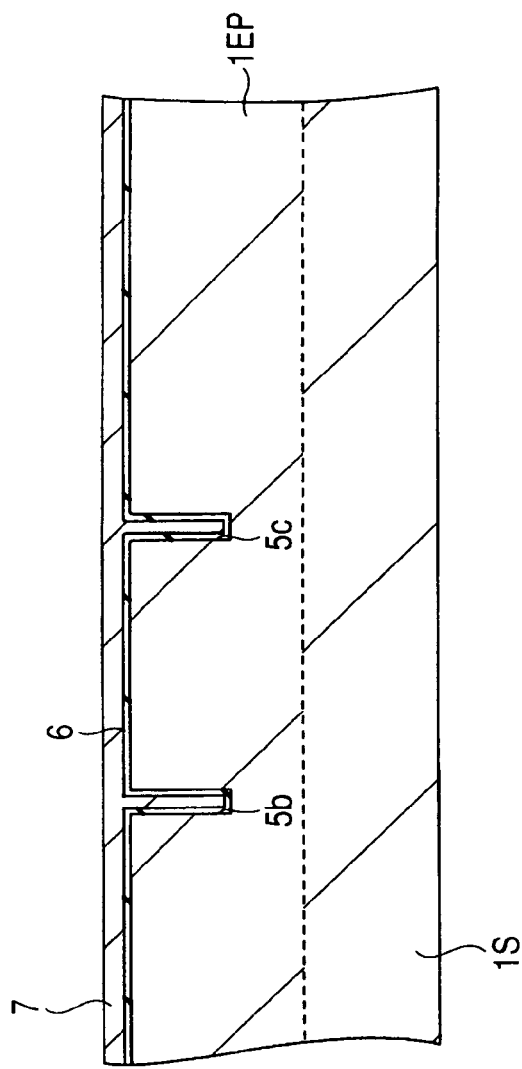
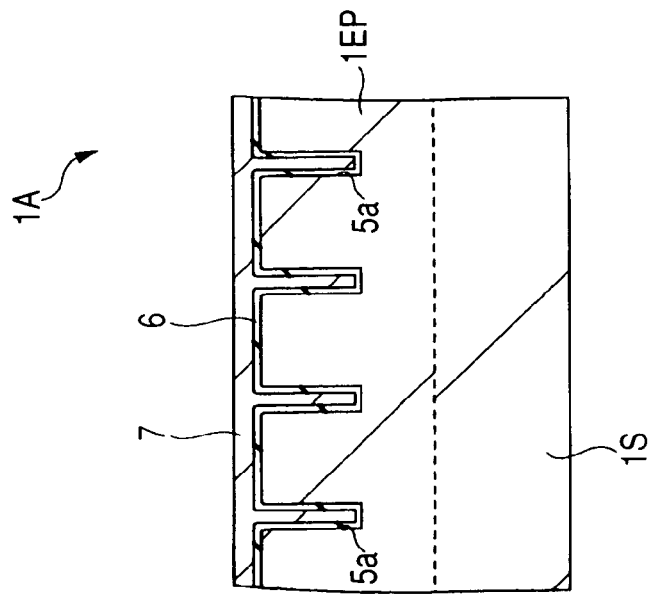

FIG. 26
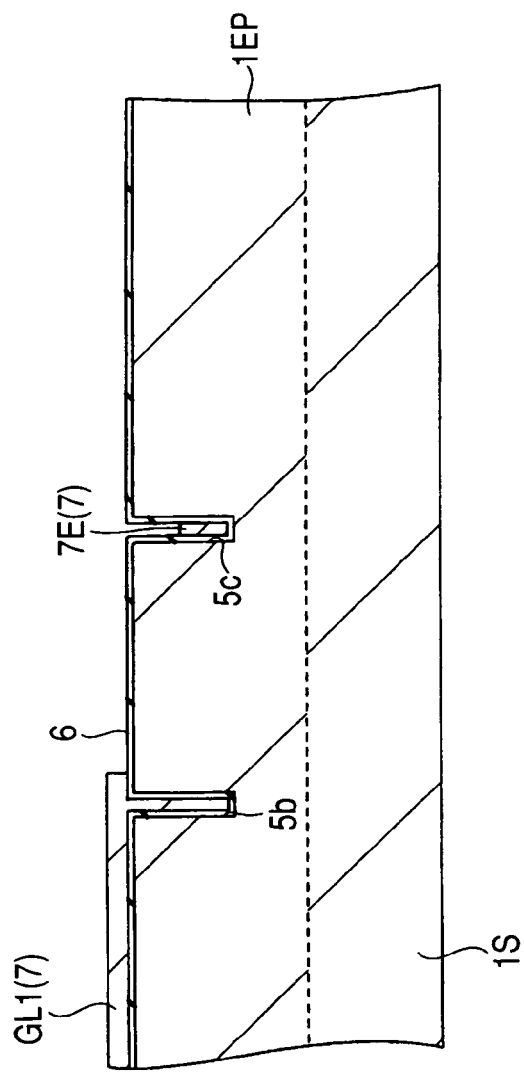
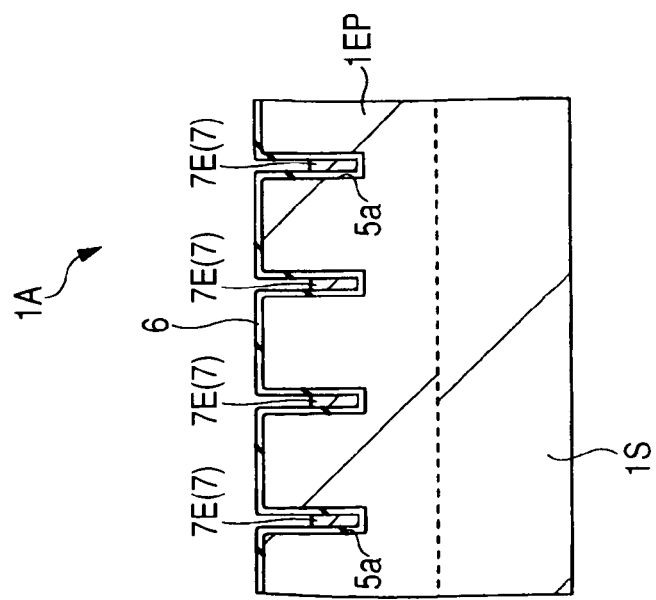

FIG. 27
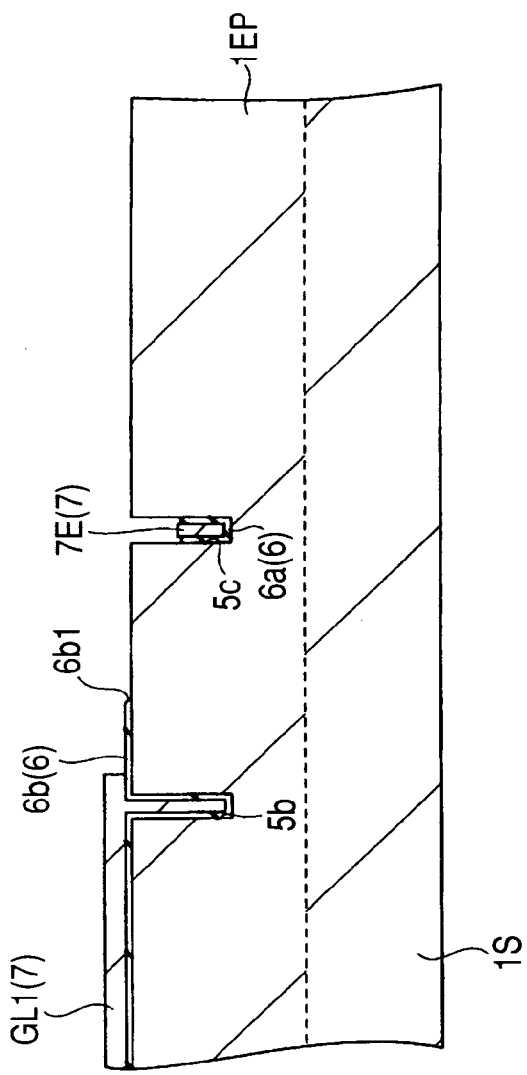
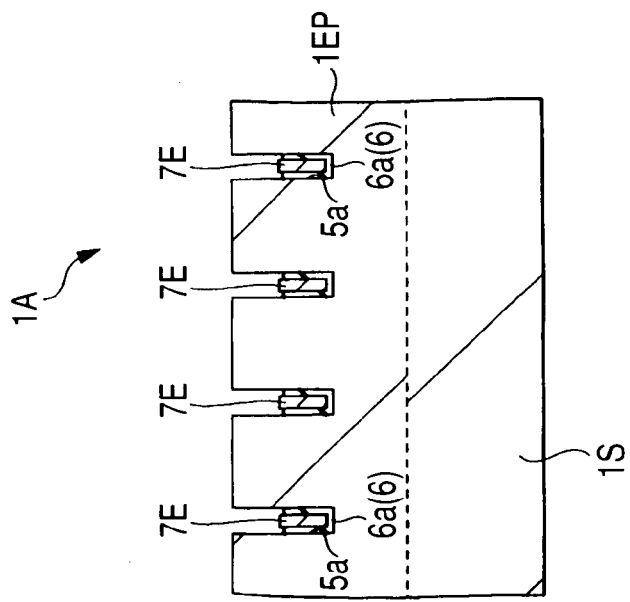

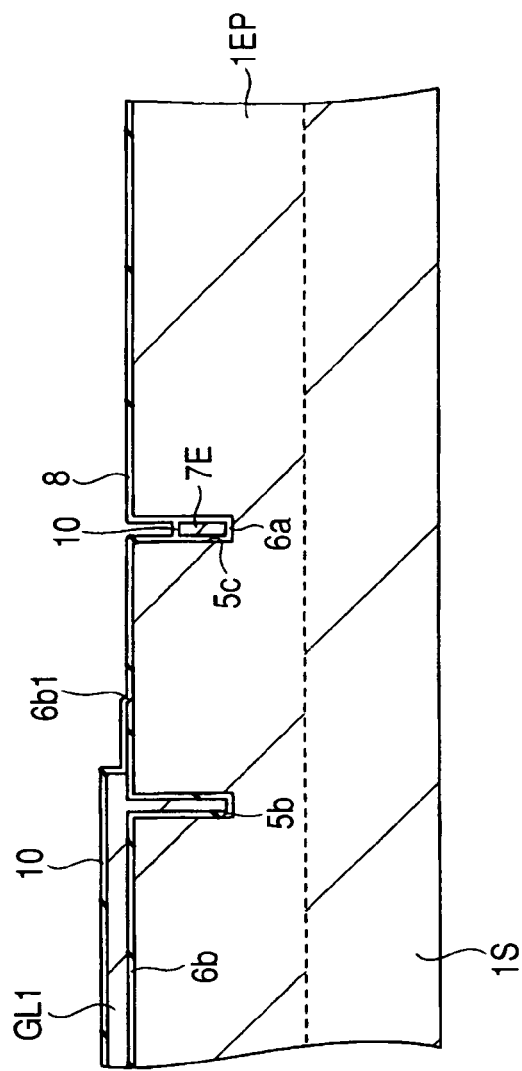
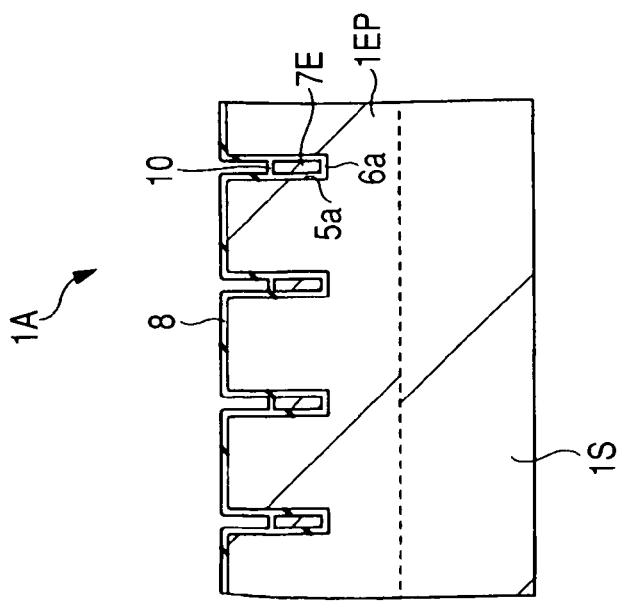
FIG. 28

FIG. 29
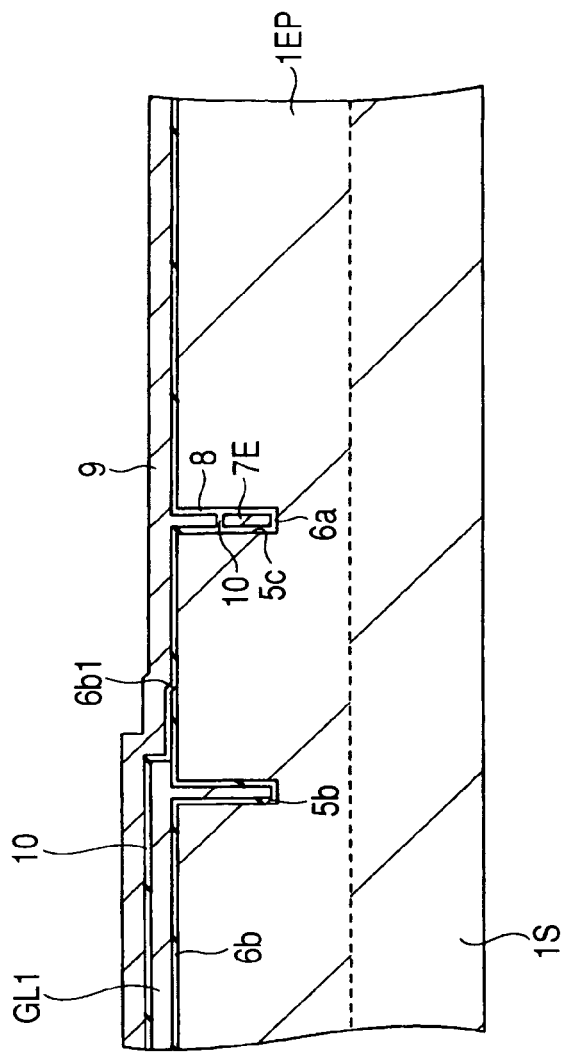
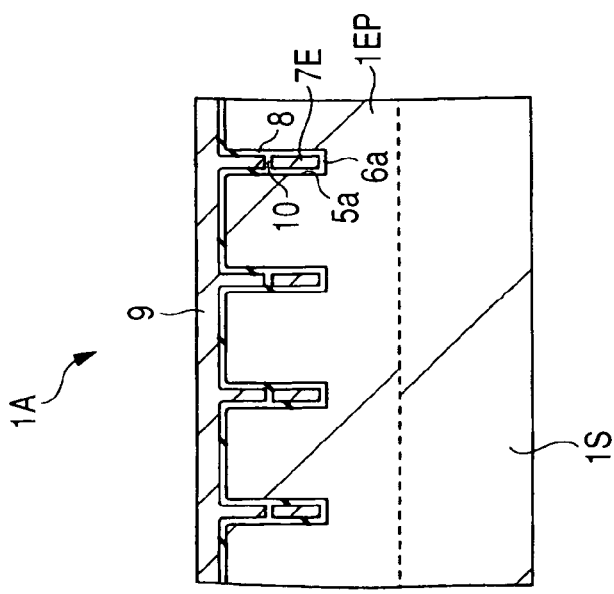

FIG. 30
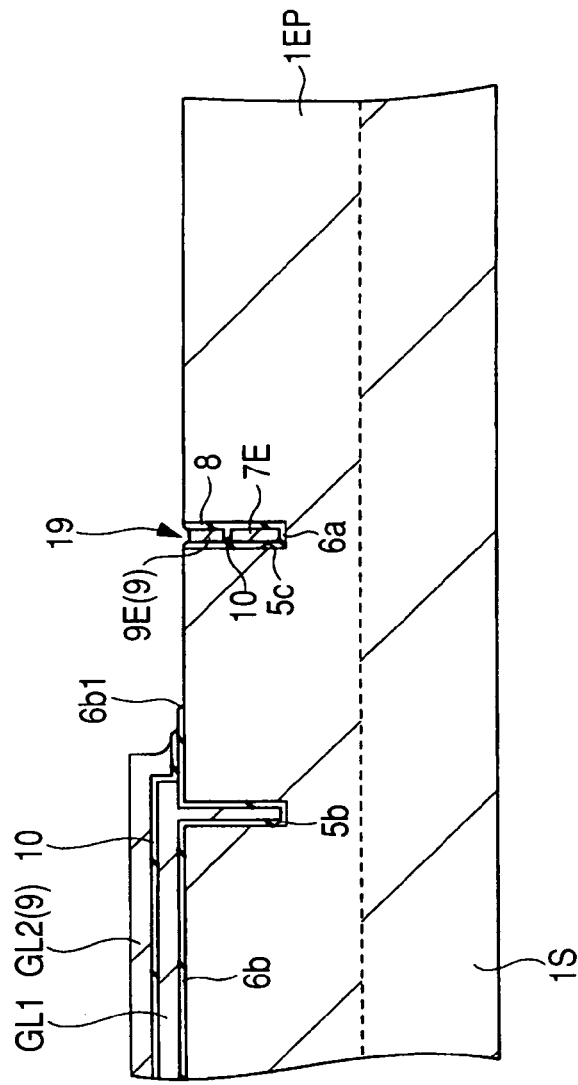
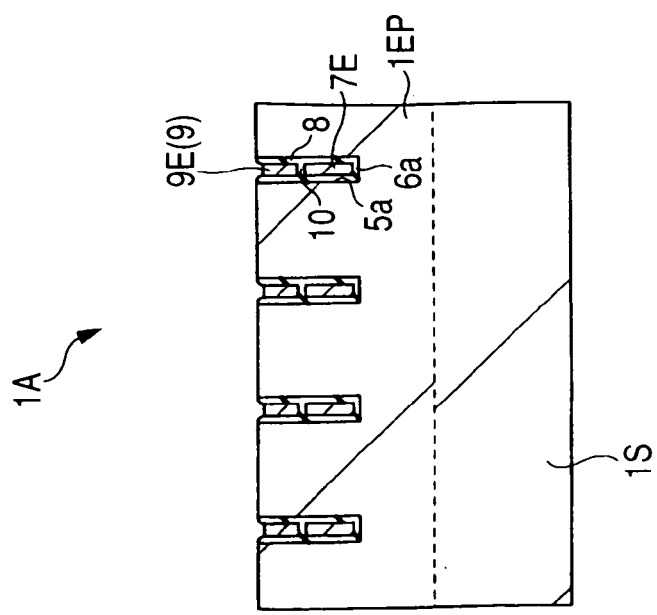

FIG. 31
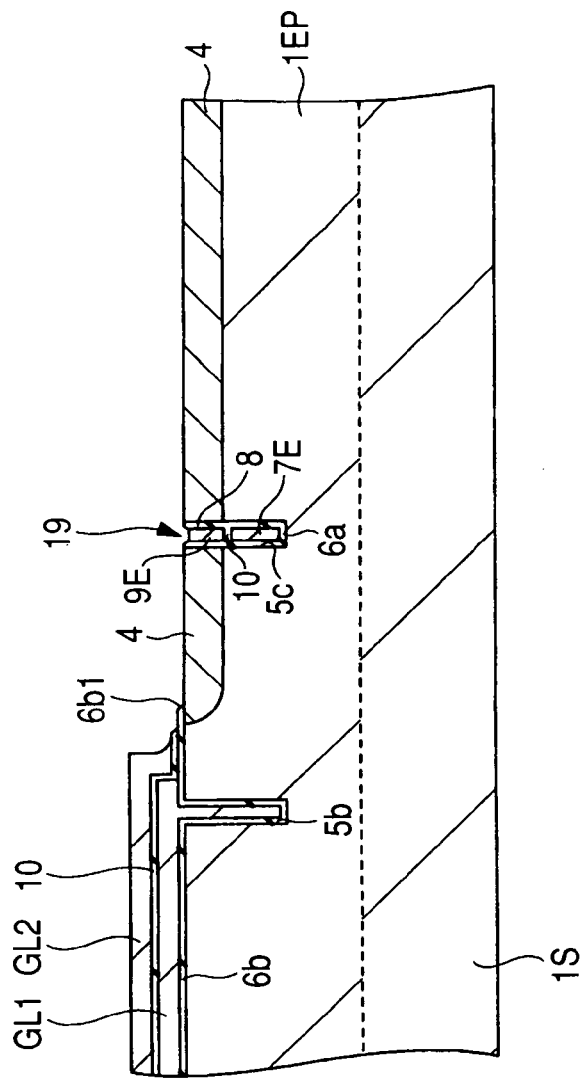
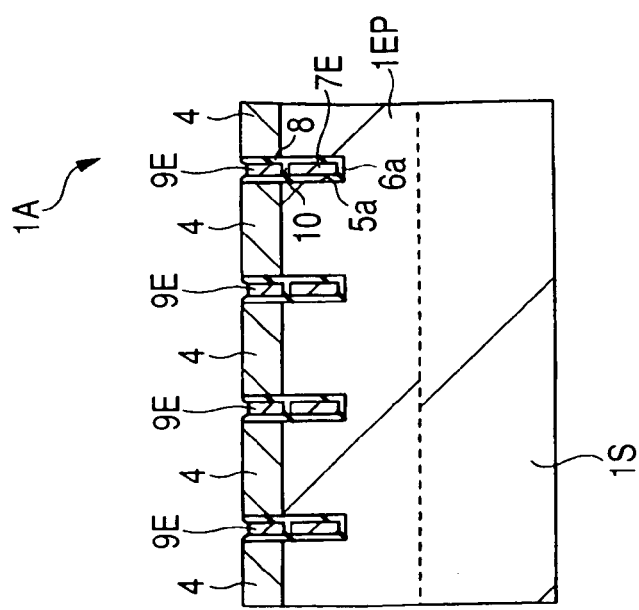

FIG. 32
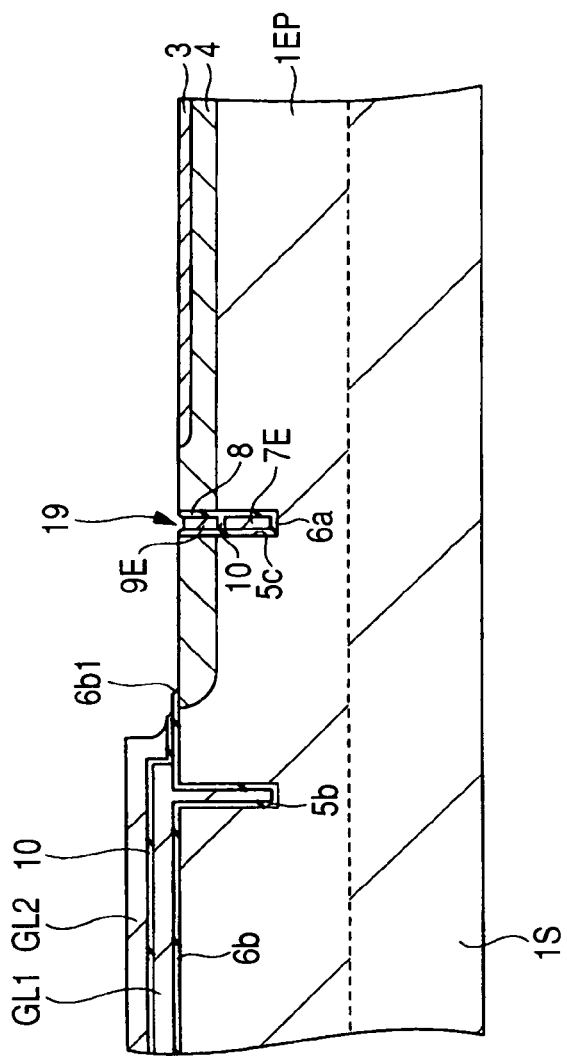
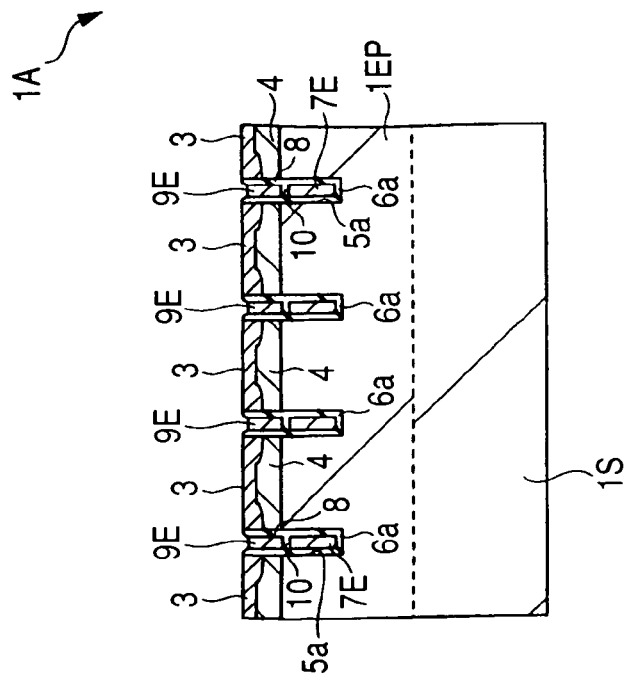

FIG. 33
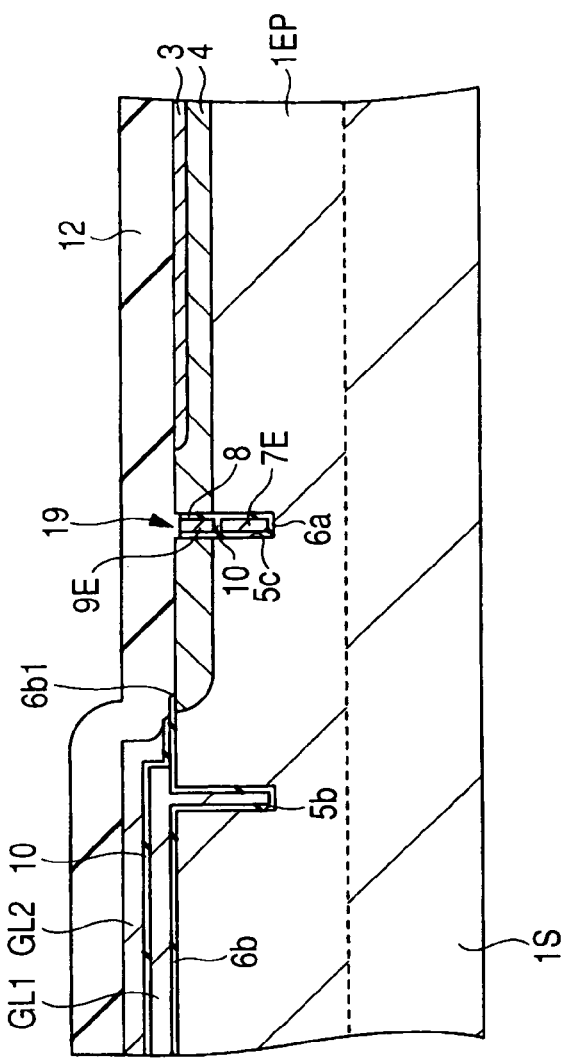
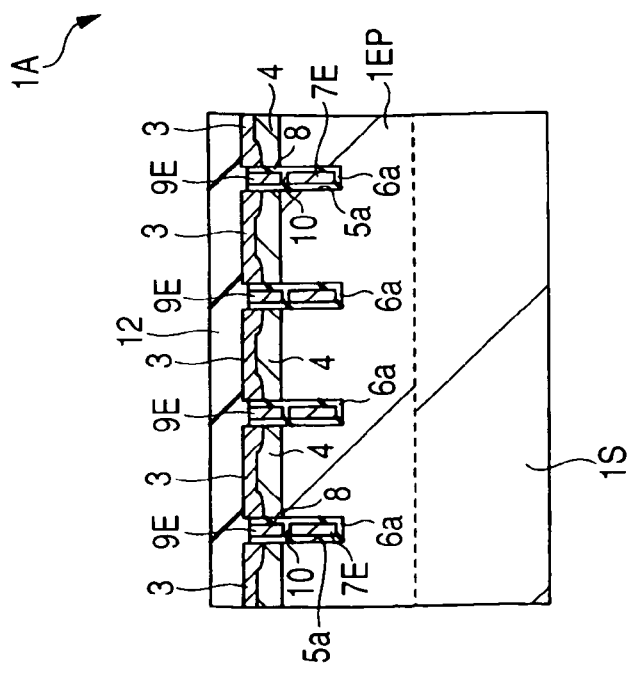

FIG. 34
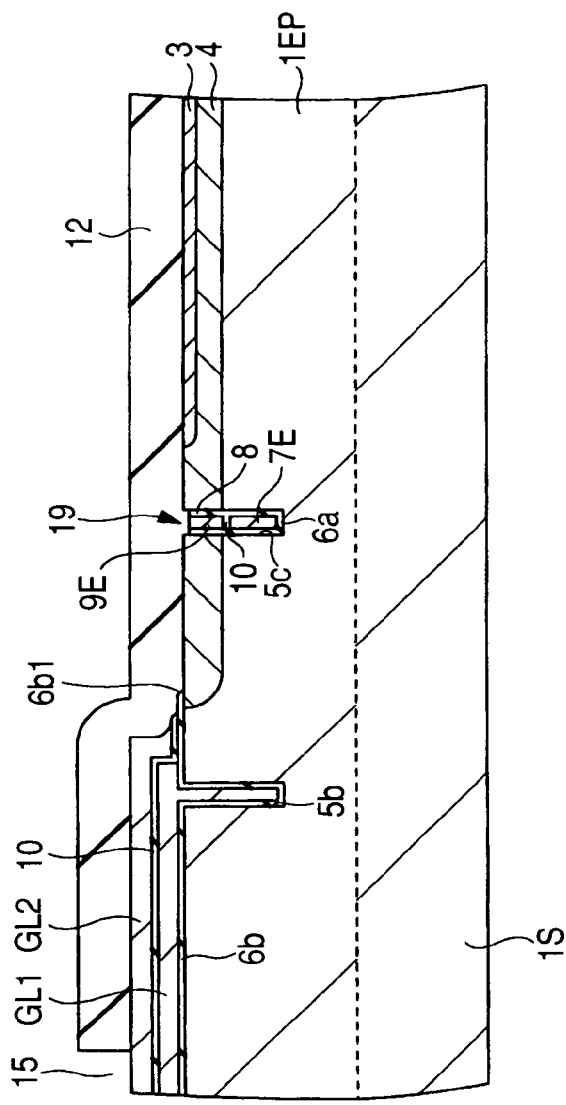
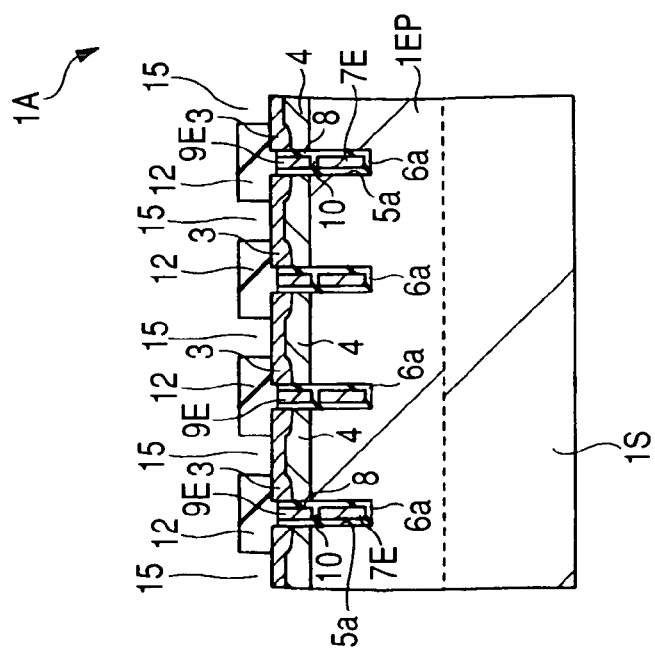

FIG. 35
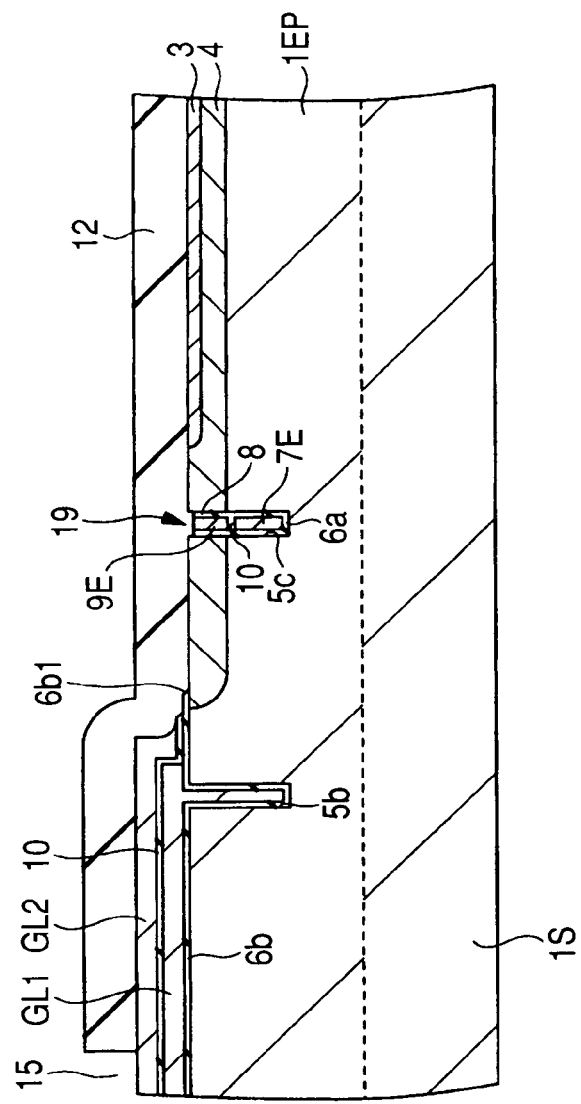
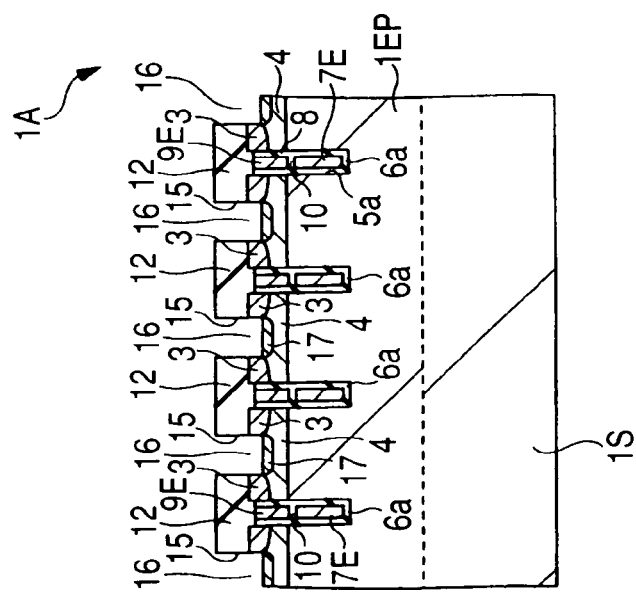

FIG. 36
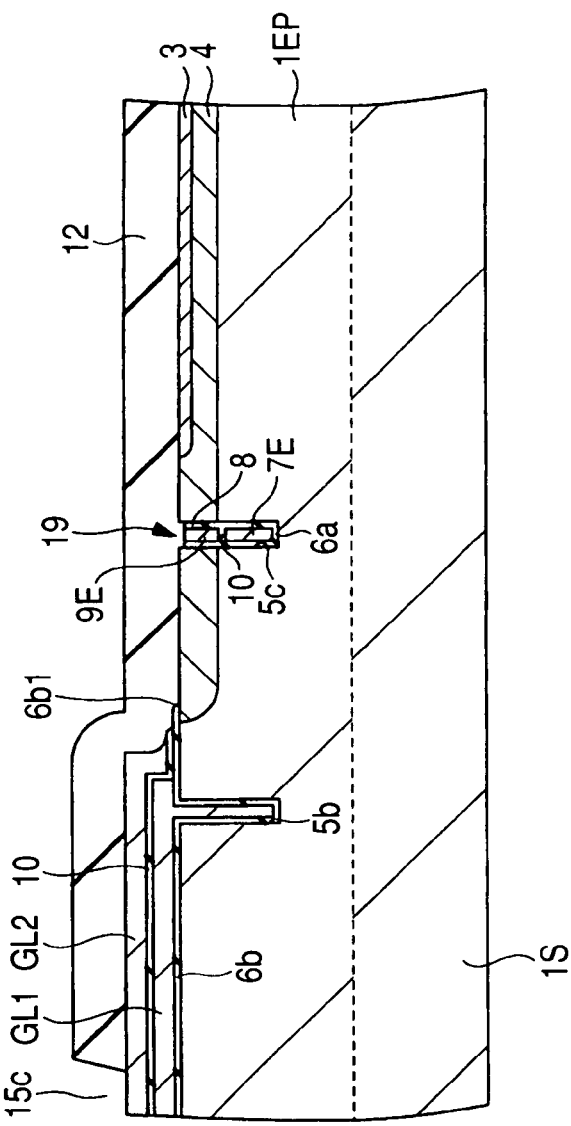
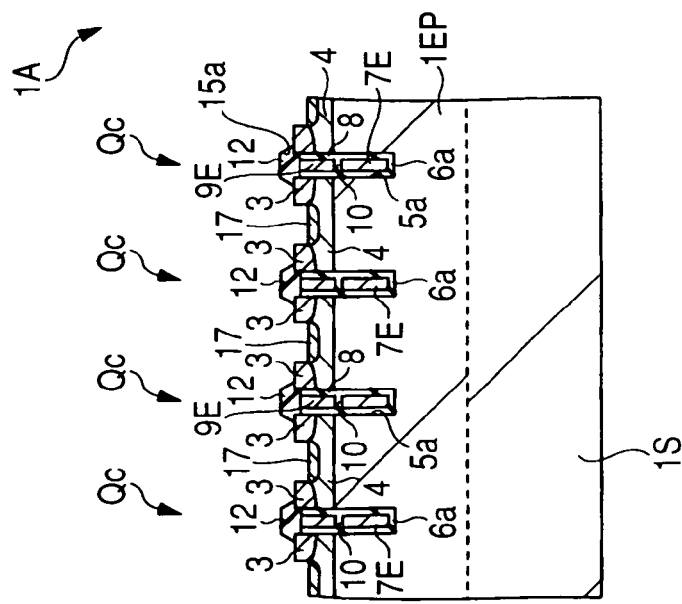

SEMICONDUCTOR DEVICE AND MANUFACTURING METHOD OF THE SAME

CROSS-REFERENCE TO RELATED APPLICATION

The present application claims priority from Japanese patent application No. 2005-012236 filed on Jan. 20, 2005, the content of which is hereby incorporated by reference into this application.

BACKGROUND OF THE INVENTION

The present invention relates to a semiconductor device of a manufacturing technique of the same, and in particular to a semiconductor device having a power transistor with a trench gate structure and a manufacturing technique of the same.

The power MOS-FET (Metal Oxide Semiconductor-Field Effect Transistor) with a trench gate structure is a vertical power transistor constructed as follows: a gate electrode is formed in a trench dug in the direction orthogonal to the main surface of a semiconductor substrate with a gate insulating layer in-between; a source region is formed in the surface part of the main surface of the semiconductor substrate; a drain region is formed on the under side of the semiconductor substrate opposite to the main surface; and a channel is formed in the portion of the semiconductor substrate that is positioned between the source region and the drain region and to which the side face of the gate electrode in the trench is opposed.

An example of such a power MOS-FET with a trench gate structure is disclosed in Japanese Unexamined Patent Publication No. 2000-196075 (Patent Document 1). FIG. 19 in Patent Document 1 illustrates a construction in which the upper part of a gate electrode buried in a trench formed in a semiconductor substrate is protruded to a level higher than the main surface of the semiconductor substrate. FIG. 26 in Patent Document 1 illustrates a construction in which the following is implemented by taking the following measures: a first opening is formed in a semiconductor substrate. The first opening penetrates a third semiconductor layer 2c for source region in the superficial layer of the main surface of the semiconductor substrate and extends to a second semiconductor layer 2b for channel formation under the third semiconductor layer 2c. Part of the interlayer insulating film 7 on the periphery of the upper part of the first opening is selectively etched and removed to form a second opening in the interlayer insulating film 7. This second opening is so formed that an end of the interlayer insulating film 7 recedes away from the first opening and the third semiconductor layer 2c for source region in the superficial layer of the main surface of the semiconductor substrate is exposed. The area of contact between a source electrode 10 buried in the first and second openings and the third semiconductor layer 2c for source region formation in the superficial layer of the main surface of the semiconductor substrate is thereby increased. At the same time, the resistance of connection between the source electrode 10 and the third semiconductor layer 2c is reduced.

[Patent Document 1] Japanese Unexamined Patent Publication No. 2000-196075 (FIG. 26 and so on)

SUMMARY OF THE INVENTION

However, the present inventors found that the above-mentioned semiconductor device having a power MOS-FET with a trench gate structure had the following problems:

The cell pitch of power MOS-FETs tends to be increasingly reduced year by year for the purpose of on-resistance reduction. When the cell pitch of a power MOS-FET is reduced, the distance between a source region and a gate region is also reduced. As a result, the distance between a source electrode and a gate electrode is increasingly reduced. Therefore, it is an important problem how demand for reduction in the cell pitch of power MOS-FETs and reduction in their on-resistance should be met.

With respect to the foregoing, there is the following problem: a parasitic MOS-FET operates between the source region on the periphery of a group of multiple cells that constitute a power MOS-FET and the insulating layer for element isolation positioned outside thereof. As a result, a leakage current is passed through the superficial layer of the main surface of the semiconductor substrate from the source region toward the insulating layer for element isolation.

An object of the present invention is to provide a technique that makes it possible to reduce the on-resistance of a semiconductor device having a field-effect transistor with a trench gate structure.

Another object of the present invention is to provide a technique that makes it possible to suppress or prevent the operation of a parasitic element of a semiconductor device having a field-effect transistor with a trench gate structure.

The above and further objects and novel features of the present invention will be apparent from the description of this specification and the accompanying drawings.

The following is a brief description of the gist of the representative elements of the invention laid open in this application.

According to an embodiment of the present invention, there is provided a semiconductor device having a field-effect transistor with a trench gate structure in which a gate electrode is formed in a trench dug in the direction orthogonal to the main surface of the semiconductor substrate. This semiconductor substrate has an insulating layer over the gate electrode having its upper face at a level lower than the main surface of the semiconductor substrate. This insulating layer is so formed that it separates the gate electrode and the source region in the main surface of the semiconductor substrate from each other. Letting the distance between an end of the insulating layer in the upper face of the source region and the end of the upper face of the source region farther from the gate electrode be a and the length of the overlap between the insulating layer and the upper face of the source region be b, the relation expressed as $b \leq a$ holds.

According to an embodiment of the present invention, there is provided a semiconductor device having a field-effect transistor with a trench gate structure in which a gate electrode is formed in a trench dug in the direction orthogonal to the main surface of a semiconductor substrate. In this semiconductor device, a cutoff trench is formed between an end of a source region on the periphery of a group of multiple cells of the field-effect transistor with a trench gate structure and an end of an insulating layer for isolation formed outside the end of the source region on the periphery of the group of the multiple cells.

The following is a brief description of the gist of the effects obtained by the representative elements of the invention laid open in this application.

A semiconductor device having a field-effect transistor with a trench gate structure is so constructed that the relation expressed as $b \leq a$ holds, where a is the distance between an end of the insulating layer in the upper face of the source region and the end of the upper face of the source region farther from the gate electrode; and b is the length of the overlap between the insulating layer and the upper face of the source region. Thus, the on-resistance of the semiconductor device can be reduced.

A semiconductor device having a field-effect transistor with a trench gate structure is so constructed that the following is implemented: a cutoff trench is formed between an end of a source region on the periphery of a group of multiple cells of the field-effect transistor with a trench gate structure and an end of an insulating layer formed outside the end of the source region on the periphery of the group of the multiple cells. Thus, the operation of parasitic elements of the semiconductor device can be suppressed or prevented.

BRIEF DESCRIPTION OF THE DRAWINGS

FIG. 20 is a sectional view of a substantial part of the semiconductor substrate of a semiconductor device in an embodiment of the present invention in the manufacturing process for the semiconductor device.

FIG. 21 is a sectional view of the substantial part of the semiconductor substrate in the manufacturing process for the semiconductor device, following FIG. 20.

FIG. 22 is a sectional view of the substantial part of the semiconductor substrate in the manufacturing process for the semiconductor device, following FIG. 21.

FIG. 23 is a sectional view of the substantial part of the semiconductor substrate in the manufacturing process for the semiconductor device, following FIG. 22.

FIG. 24 is a sectional view of the substantial part of the semiconductor substrate in the manufacturing process for the semiconductor device, following FIG. 23.

FIG. 25 is a sectional view of the substantial part of the semiconductor substrate in the manufacturing process for the semiconductor device, following FIG. 24.

FIG. 26 is a sectional view of the substantial part of the semiconductor substrate in the manufacturing process for the semiconductor device, following FIG. 25.

FIG. 27 is a sectional view of the substantial part of the semiconductor substrate in the manufacturing process for the semiconductor device, following FIG. 26.

FIG. 28 is a sectional view of the substantial part of the semiconductor substrate in the manufacturing process for the semiconductor device, following FIG. 27.

FIG. 29 is a sectional view of the substantial part of the semiconductor substrate in the manufacturing process for the semiconductor device, following FIG. 28.

FIG. 30 is a sectional view of the substantial part of the semiconductor substrate in the manufacturing process for the semiconductor device, following FIG. 29.

FIG. 31 is a sectional view of the substantial part of the semiconductor substrate in the manufacturing process for the semiconductor device, following FIG. 30.

FIG. 32 is a sectional view of the substantial part of the semiconductor substrate in the manufacturing process for the semiconductor device, following FIG. 31.

FIG. 33 is a sectional view of the substantial part of the semiconductor substrate in the manufacturing process for the semiconductor device, following FIG. 32.

FIG. 34 is a sectional view of the substantial part of the semiconductor substrate in the manufacturing process for the semiconductor device, following FIG. 33.

FIG. 35 is a sectional view of the substantial part of the semiconductor substrate in the manufacturing process for the semiconductor device, following FIG. 34.

FIG. 36 is a sectional view of the substantial part of the semiconductor substrate in the manufacturing process for the semiconductor device, following FIG. 35.

DETAILED DESCRIPTION OF THE PREFERRED EMBODIMENTS

In the following description, each embodiment will be divided into multiple sections or embodiments if necessary for the sake of convenience. Unless explicitly stated otherwise, they are not unrelated to one another, and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies, and the number may be above or below that specific number. In the following description of embodiments, needless to add, their constituent elements (including elemental steps and the like) are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges. In every drawing for explaining embodiments of the present invention, members having the same function will be marked with the same numeral, and the repetitive description thereof will be omitted as much as possible. Hereafter, detailed description will be given to embodiments of the present invention with reference to the drawings.

First Embodiment

Figure 1:
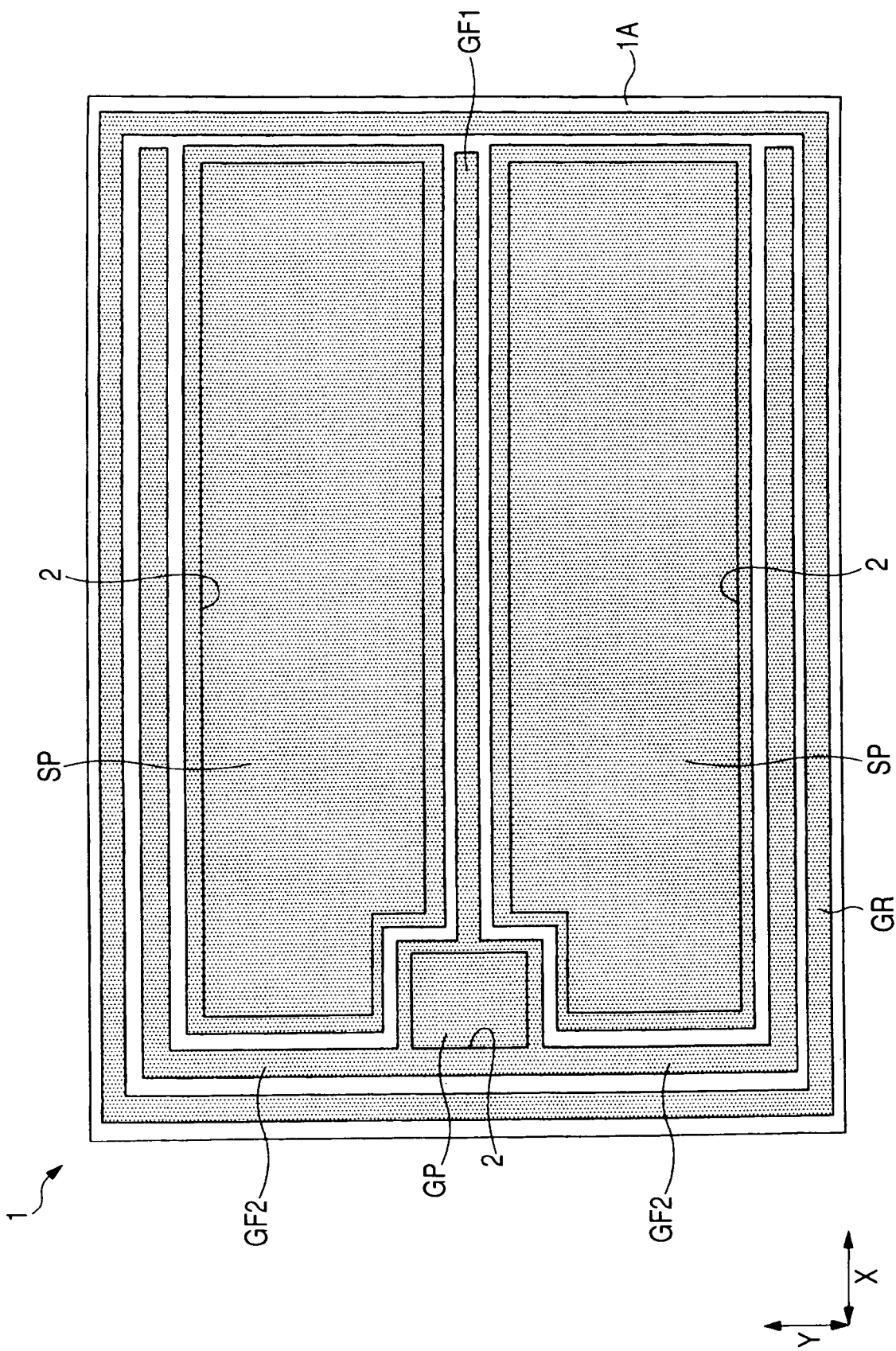
FIG. 1 is a plan view of a semiconductor chip that constitutes a semiconductor device in an embodiment of the present invention.
Figure 2:
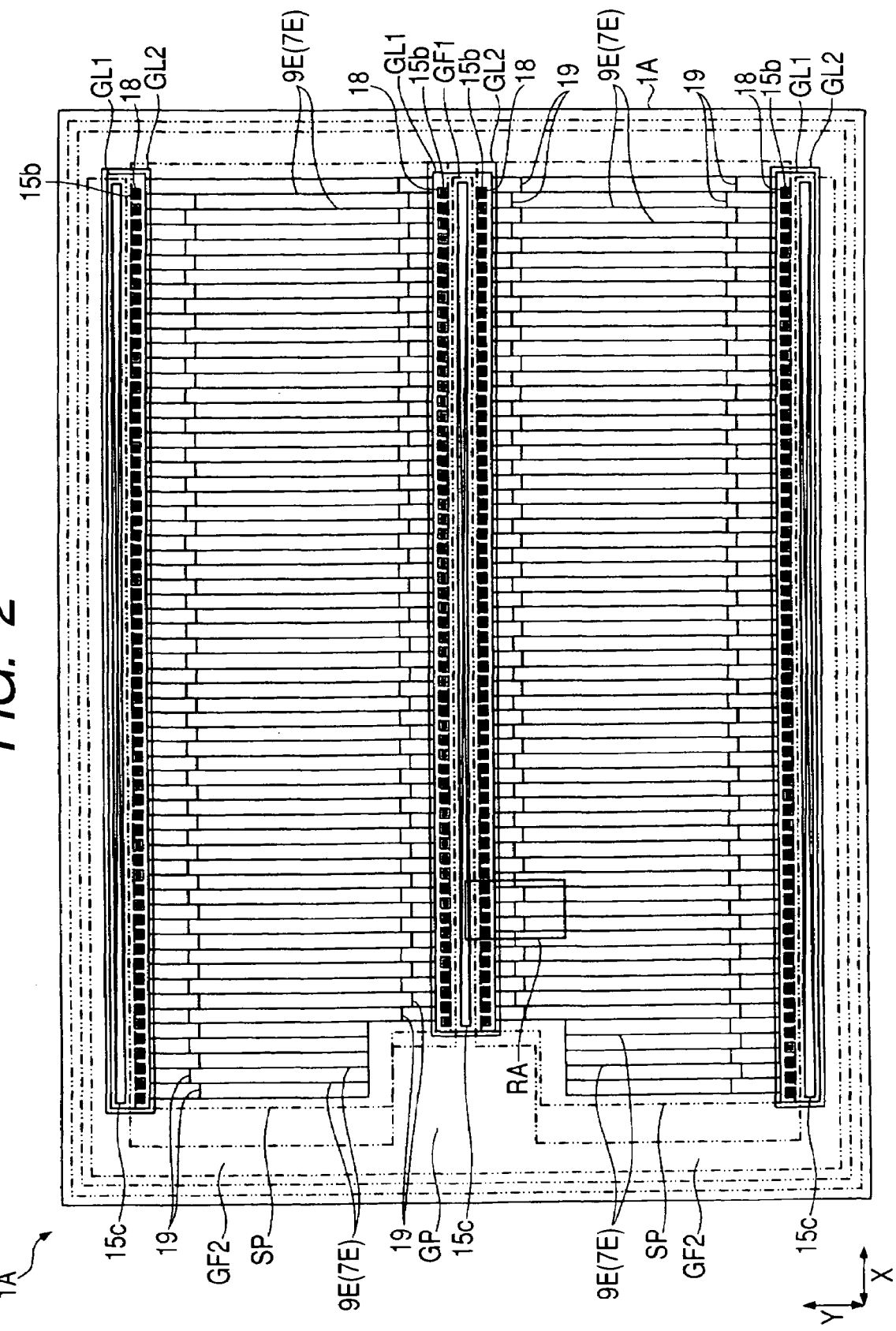
FIG. 2 is a plan view of the semiconductor chip in FIG. 1.
Figure 3:
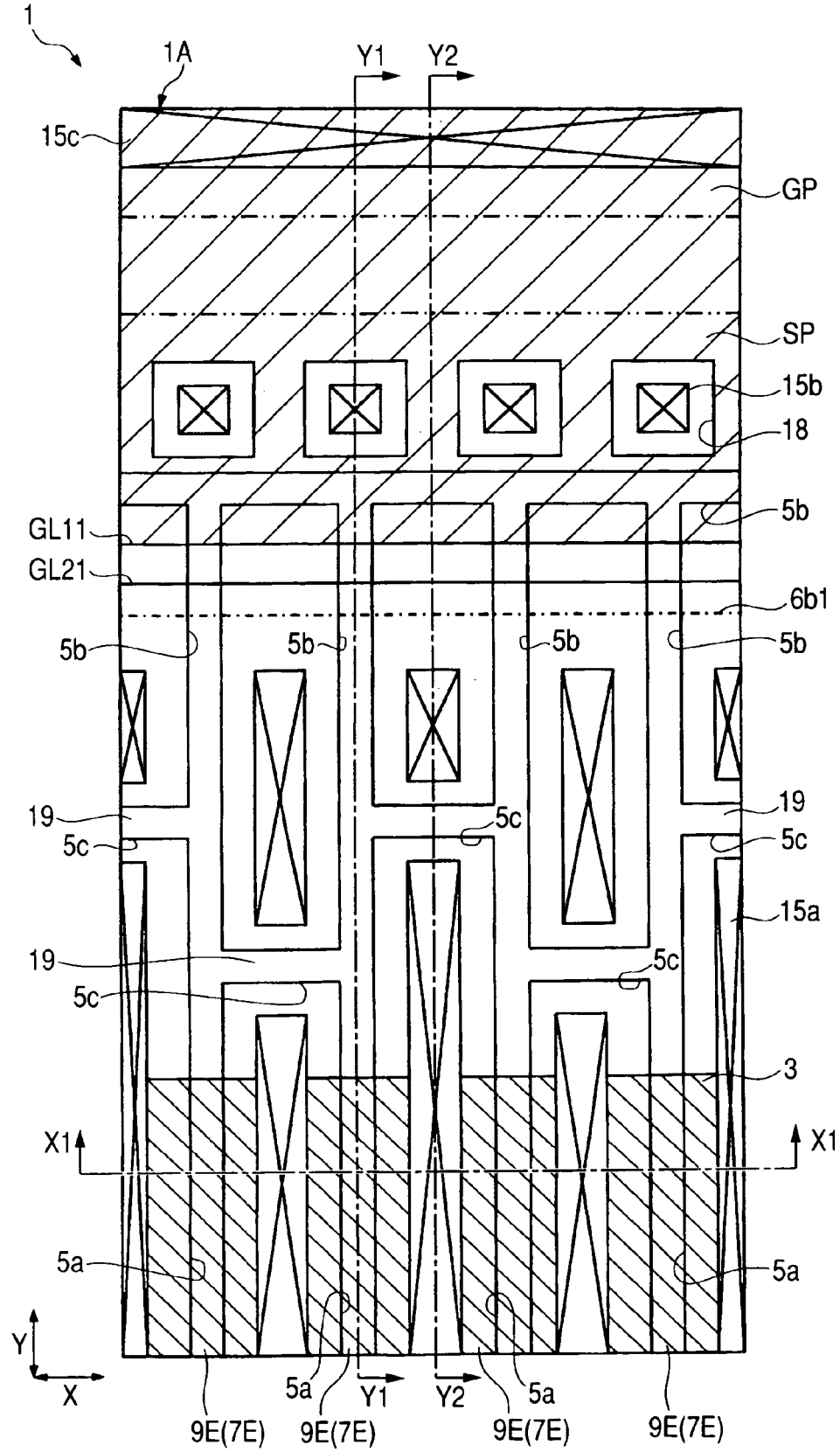
FIG. 3 is an enlarged plan view of area RA in the semiconductor chip in FIG. 2.
Figure 4:
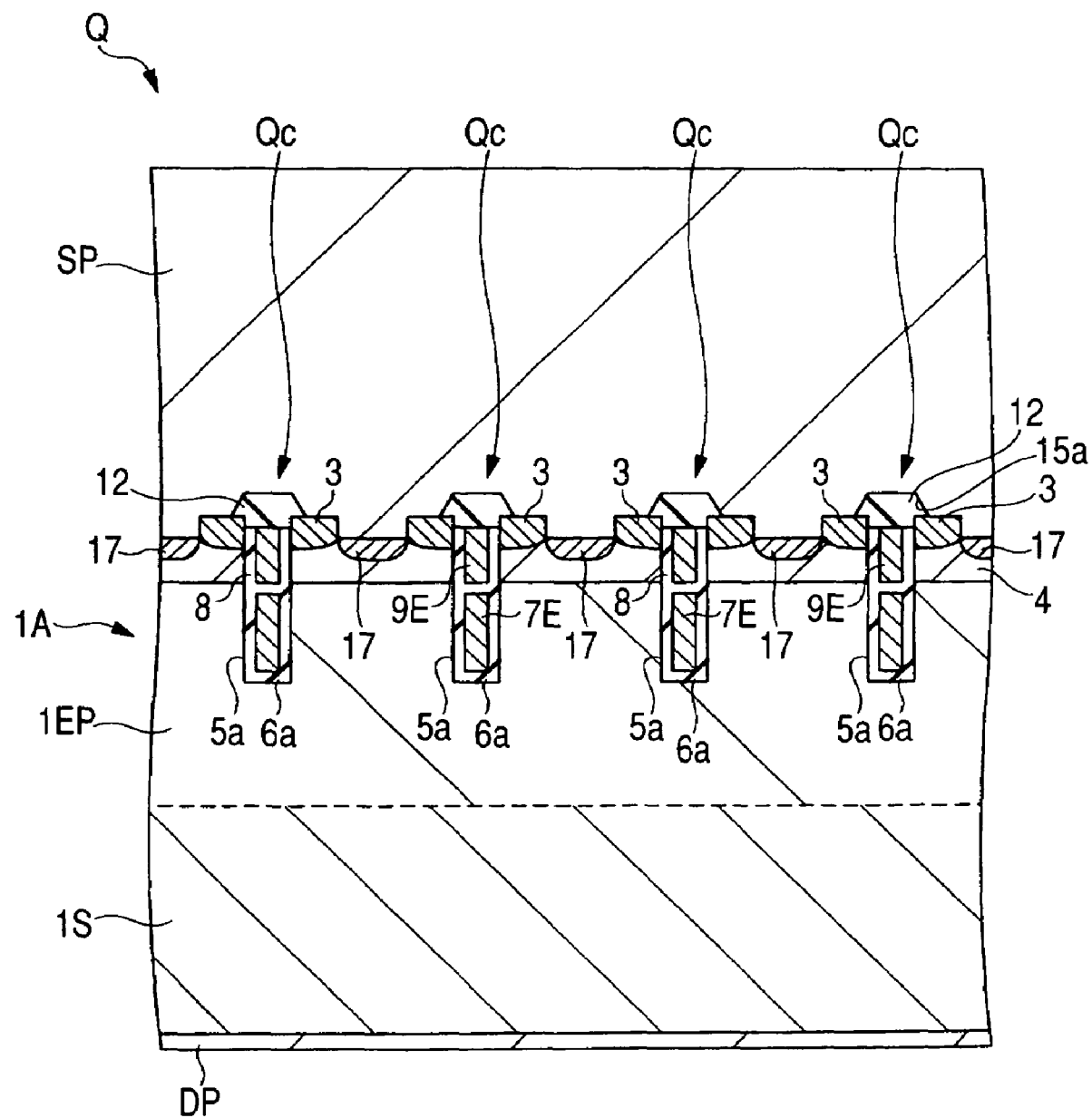
FIG. 4 is a sectional view taken along line X1-X1 of FIG. 3.
Figure 5:
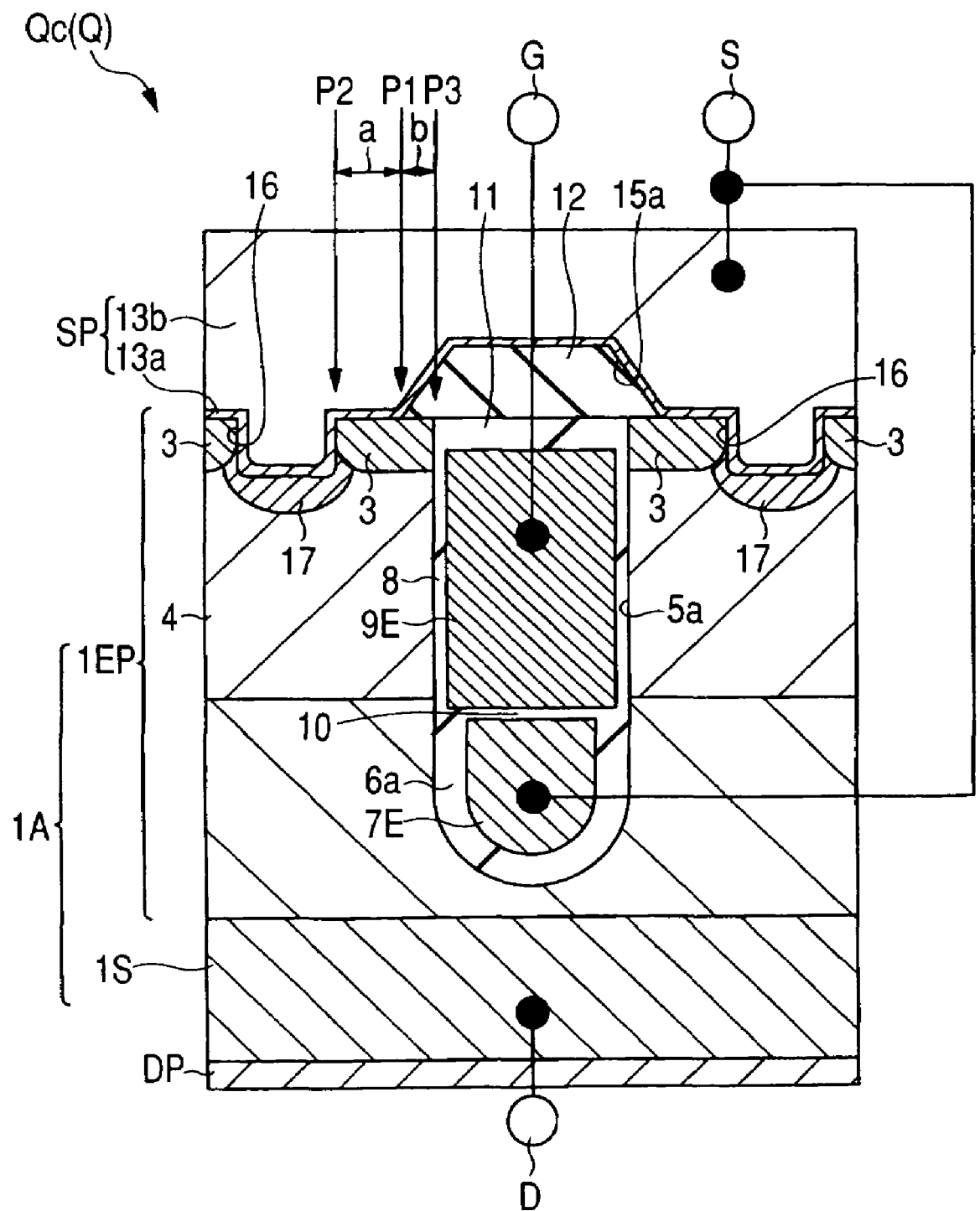
FIG. 5 is an enlarged sectional view of a substantial part of the semiconductor chip in FIG. 4.
Figure 6:
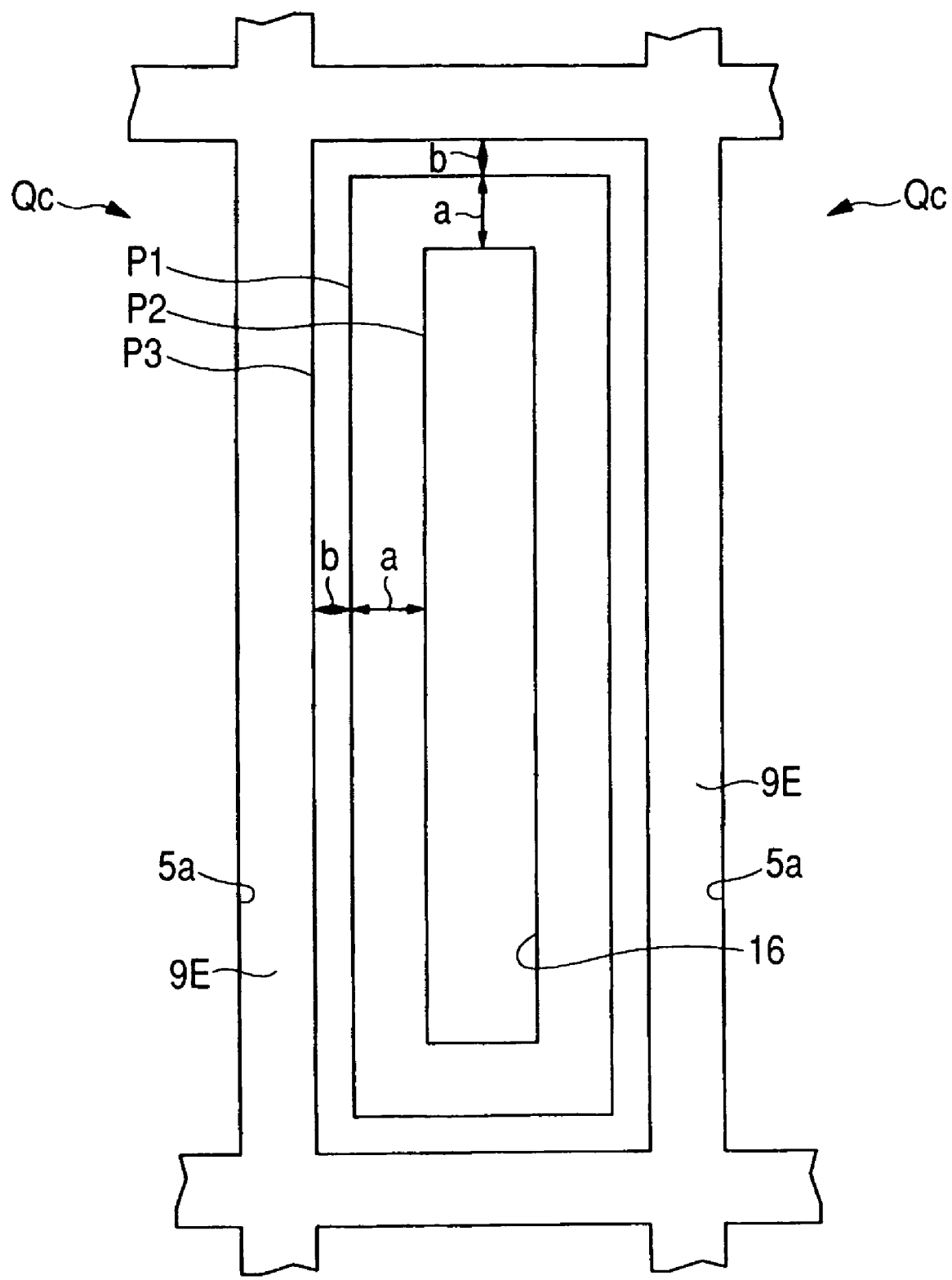
FIG. 6 is an enlarged plan view of a substantial part of the semiconductor chip in FIG. 3.
Figure 7:
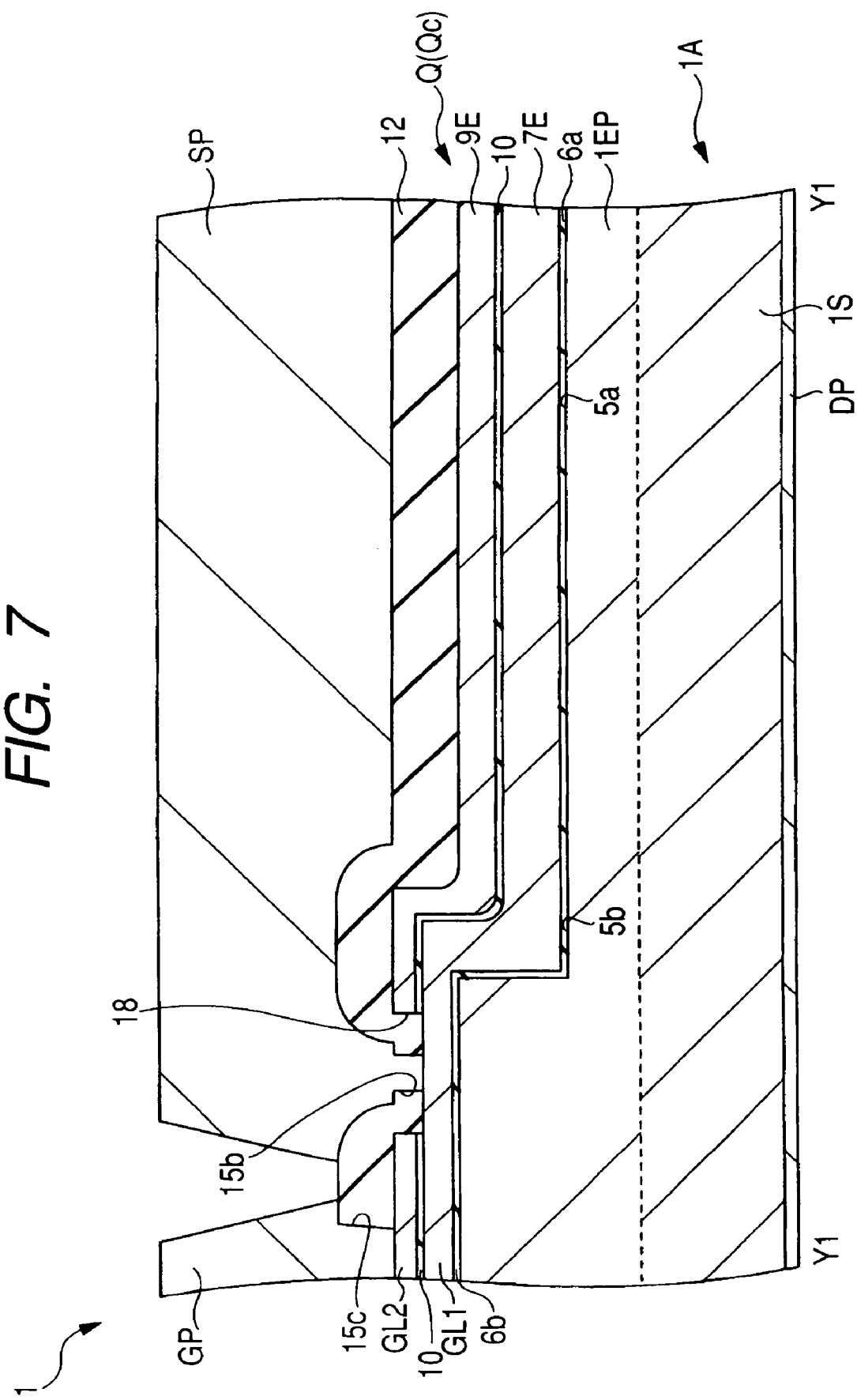
FIG. 7 is a sectional view taken along line Y1-Y1 of FIG. 3.

FIG. 1 and FIG. 2 are plan views of a semiconductor chip that constitutes a semiconductor device in a first embodiment; FIG. 3 is an enlarged plan view of area RA in the semiconductor chip in FIG. 2; FIG. 4 is a sectional view taken along line X1-X1 of FIG. 3; FIG. 5 is an enlarged sectional view of a substantial part of the semiconductor chip in FIG. 4; FIG. 6 is an enlarged plan view of a substantial part of the semiconductor chip in FIG. 3; and FIG. 7 is a sectional view taken along line Y1-Y1 of FIG. 3. Code Y indicates a first direction, and code X indicates a second direction orthogonal to the first direction. The first direction Y is equivalent to the direction of the short sides of the semiconductor chip. It is also equivalent to the direction of the length (extension) of the gate electrode of a power MIS-FET (Metal Insulator Semiconductor-Field Effect Transistor). The second direction X is equivalent to the direction of the length of the semiconductor chip, and is also equivalent to the direction of the short sides of the gate electrode of the power MIS-FET. In FIG. 2, the main surface (first main surface) of the semiconductor chip is rendered to be transparent for the purpose of making the description easy to understand. In FIG. 5, code G denotes the gate of the power MIS-FET; S denotes the source of the power MIS-FET; and D denotes the drain of the power MIS-FET.

The semiconductor substrate (hereafter, simply referred to as "substrate") 1A of the semiconductor chip (hereafter, simply referred to as "chip") 1 formed in a rectangular planar shape includes the following: a substrate portion 1S and an epitaxial layer 1EP formed over its main surface. The substrate portion 1S is composed of, for example, an $n^+$-type silicon (Si) single crystal, and the epitaxial layer 1EP is composed of an n-type silicon single crystal higher in resistivity than the substrate portion 1S. This substrate 1A has a main surface (first main surface) and a secondary surface (second main surface) positioned opposite to each other. The main surface of the substrate 1A is equivalent to the upper face of the above-mentioned epitaxial layer 1EP, and the secondary surface of the substrate 1A is equivalent to the lower face of the above-mentioned substrate portion 1S.

In the uppermost wiring layer in the main surface of this substrate 1A, the following are disposed: a gate pad GP that uses, for example, aluminum (Al) or aluminum alloy as the principal electrode material; gate fingers GF1 and GF2, source pads (source electrodes) SP and a guard ring GR. Over the entire secondary surface of the substrate 1A, there is disposed a drain pad DP that uses, for example, gold (Au) as the principal electrode material.

The gate pad GP is an external terminal electrically connected with the gate electrode of the power MIS-FET. It is disposed in proximity to one end of the chip 1 in the second direction X and substantially in the center in the first direction Y. The gate pad GP is formed integrally with the gate fingers GF1 and GF2. One GF1 of the gate fingers is extended in the center in the first direction Y from the gate pad GP in proximity to one end of the chip 1 in the second direction X toward the other end of the chip 1 in the second direction X. It is extended so that it divides the chip 1 into the upper and lower halves. The other gate finger GF2 is extended from the gate pad GP in proximity to one end of the chip 1 in the second direction X. It is extended in proximity to the periphery of the chip 1 along the periphery, and is terminated at the other end of the chip 1 in the second direction X.

The above-mentioned source pads SP are external terminals for the source electrode of the power MIS-FET, and each of them is disposed above and below the gate finger GF1. Each source pad SP is insulated from the gate pad GP and the gate fingers GF1 and GF2. The source pads SP are identical in planar shape and dimensions, and are disposed symmetrically with respect to the gate finger GF1. Each source pad SP is patterned in a rectangular shape long in the second direction X, and is so formed that its planar size is larger than the planar size of the gate pad GP.

In the uppermost insulating layer in the main surface of the chip 1, a surface protection film is so formed that it covers the gate pad GP, gate fingers GF1 and GF2, source pads SP, and guard ring GR. Openings 2 are formed in part of the surface protection film, and the gate pad GP and the source pads SP are partly exposed in the openings 2. A bonding wire or the like is to be connected to the gate pad GP and the source pads SP exposed in the openings 2.

In the element formation regions encircled with the gate fingers GF1 and GF2 in the main surface of the chip 1, multiple cells Qc of the power MIS-FET Q with a trench gate structure are disposed. Description will be given to the configuration of the cells Qc of the power MIS-FET Q with a trench gate structure.

This cell Qc is formed of an n channel-type field-effect transistor, and includes: an $n^+$-type semiconductor region 3 for source, provided over the epitaxial layer 1EP in the main surface of the substrate 1A; an $n^+$-type substrate portion 1S on the secondary surface side of the substrate 1A; a semiconductor region for drain formed of the n-type epitaxial layer 1EP; and a p-type semiconductor region 4 for channel formation, provided in the epitaxial layer 1EP between these regions. The semiconductor region 3 contains, for example, phosphorus (P) or arsenic (As), and the semiconductor region 4 contains, for example, boron (B).

Multiple trenches (first trenches) 5a that are extended in the direction orthogonal to the main surface of the substrate 1A are formed in the main surface of the substrate 1A. Each trench 5a is so formed that it is extended from the main surface of the substrate 1A, penetrates the semiconductor region 3 for source and the semiconductor region 4 for channel formation, and is terminated at the semiconductor region for drain. (In this case, each trench is terminated at the lower part of the epitaxial layer 1EP.) A dummy gate electrode 7E is provided at the lower part of the interior of each trench 5a via a gate insulating layer (first insulating layer) 6a. A gate electrode 9E is provided at the upper part of the interior of each trench 5a via a gate insulating layer 8. The gate insulating layers 6a and 8 are both formed of, for example, silicon oxide (SiO$_2$ or the like). They are so formed that the gate insulating layer 6a is thicker than the gate insulating layer 8. Specifically, the thickness of the gate insulating layer 6a is, for example, 200 nm or so, and the thickness of the gate insulating layer 8 is, for example, 50 nm or so.

Each dummy gate electrode 7E and each gate electrode 9E are both formed of, for example, low-resistance polycrystalline silicon. They are insulated from each other by an insulating layer (second insulating layer) 10 placed between the dummy gate electrode 7E and the gate electrode 9E. The dummy gate electrodes 7E are electrically connected with the above-mentioned source pads SP, and are supplied with reference potential (e.g., ground potential of 0V). The functions of the dummy gate electrode 7E will be described later.

Each gate electrode 9E is a control electrode for the power MIS-FET Q, and voltage for controlling the operation of the power MIS-FET Q is applied thereto. The upper face of each gate electrode 9E is slightly lower than the main surface of the substrate 1A. (It is slightly lower than the upper face of the semiconductor region 3 for source over the epitaxial layer 1EP.) An insulating layer 11 formed of, for example, silicon oxide is buried over the low sunken upper face of the gate electrodes 9E. The channels of the cells Qc of the power MIS-FET Q are formed in the semiconductor region 4 for channel formation opposed to the side faces of the gate electrodes 9E. That is, the channel currents of the cells Qc of the power MIS-FET Q flow along the side faces of the trenches 5a in the direction of the thickness of the substrate 1A orthogonal to the main surface of the substrate 1A.

An interlayer insulating layer 12 is formed over the gate electrodes 9E with the above-mentioned insulating layer 11 in-between. The interlayer insulating layer 12 is formed of, for example, silicon oxide, and part of its periphery covers the upper faces of the semiconductor regions 3 for source. The above-mentioned source pads SP are formed over this interlayer insulating layer 12. Each of the source pads SP is of laminated structure and includes a relatively thin barrier metal layer 13a and a relatively thick metal layer 13b deposited thereover. The barrier metal layer 13a is formed of, for example, titanium tungsten (TiW), and the metal layer 13b is formed of, for example, aluminum or aluminum alloy.

The source pads SP are electrically connected with the upper faces of the semiconductor regions 3 for source of the power MIS-FET, exposed in contact holes 15a formed in the interlayer insulating layer 12, therethrough. Trenches (second trenches) 16 are formed in the substrate 1A at the bottom of the contact holes 15a. The trenches are extended in the direction orthogonal to the main surface of the substrate 1A, penetrate the semiconductor regions 3 for source, and are terminated in the semiconductor region 4 for channel formation. The source pads SP are brought into contact with the semiconductor regions 3 for source through the side faces of the trenches 16, and are electrically connected therewith. At the same time, the source pads are brought into contact with the p$^+$-type semiconductor regions 17 at the bottom of the trenches 16, and are electrically connected with the semiconductor region 4 for channel formation therethrough. The p$^+$-type semiconductor regions 17 contain, for example, boron. The side faces of the contact holes 15a are formed as inclined planes (in forward tapered shape) so that their opening size is gradually increased as they go upward from the bottom of the contact holes 15a.

Here, as illustrated in FIG. 5 and FIG. 6, the following assumption will be made: a is taken as the distance (exposed length) between an end of the interlayer insulating layer 12 over the upper face of a semiconductor region 3 for source (position P1) and the end of the upper face of the semiconductor region 3 for source farther from the gate electrode 9E (position 2 on the periphery of the trench 16); and b is taken as the length of the overlap between the interlayer insulating layer 12 and the upper face of the semiconductor region 3 for source (distance between position P1 and position P3 on the periphery of the trench 5a: overlap length or covering length). Thus, the first embodiment is so constructed that b≦a. The above-mentioned length b may be 0 (zero). That is, the first embodiment is so constructed that 0≦b≦a. This construction will be described in detail later.

The disposition of the above-mentioned dummy gate electrodes 7E and gate electrodes 9E is, for example, of stripe type. That is, the multiple dummy gate electrodes 7E and gate electrodes 9E that are extended in the first direction Y are disposed in juxtaposition in the second direction X in the main surface of the chip 1. The adjoining pitch of the dummy gate electrodes 7E and the gate electrodes 9E is, for example, 2.2 μm or less. (The lower limit of the adjoining pitch of the dummy gate electrodes 7E and the gate electrodes 9E is determined by the resolution limit for the relevant generation.) Thus, the parasitic resistance can be reduced, and the gate density per unit area can be enhanced. For this reason, the on-resistance can be reduced, and the performance of the power MIS-FET Q can be enhanced.

Gate wirings GL1 and GL2 are disposed in the isolation regions at both ends of the dummy gate electrodes 7E and the gate electrodes 9E in the first direction Y. Each gate wiring GL1 or GL2 is patterned in a band shape extended in the second direction X, and the gate wirings are disposed in the same planar position. Code GL11 in FIG. 3 indicates an end of a gate wiring GL1 (that is, the position of the periphery of the gate wiring GL1). Code GL21 in the same figure indicates an end of a gate wiring GL2 (that is, the position of the periphery of the gate wiring GL2).

The gate wirings GL1 are formed over the insulating layer 6b for isolation in the main surface of the substrate 1S. The insulating layer 6b is formed of, for example, silicon oxide (SiO$_2$ or the like), and is formed in the same process as the above-mentioned gate insulating layer 6a. Code 6b1 in FIG. 3 indicates an end of the insulating layer 6b (that is, the position of the boundary for removal of the insulating layer 6b.) The gate wirings GL1 are formed of, for example, low-resistance polycrystalline silicon, and are formed integrally with and electrically connected with the above-mentioned dummy gate electrodes 7E. The gate wirings GL1 and the dummy gate electrodes 7E are integrally connected through the lead-out trenches 5b formed in the main surface of the substrate 1A. (Refer to FIG. 7.) The gate wirings GL1 are brought into contact with and electrically connected with the above-mentioned source pads SP through contact holes 15b. The contact holes 15b are perforated in the interlayer insulating layer 12 over the main surface of the substrate 1A in the isolation region. That is, the source pads SP are electrically connected with the dummy gate electrodes 7E through the gate wirings GL1. The contact holes 15b are disposed in the openings 18 perforated in the gate wirings GL2 so that the gate wirings GL1 and the gate wirings GL2 are not electrically connected with each other through the source pads SP.

The gate wiring GL2 are formed over the gate wirings GL1 with the insulating layer (second insulating layer) 10 in-between. Thus, the gate wirings GL1 and GL2 are insulated from each other. The gate wirings GL2, excepting part thereof, are covered with the interlayer insulating layer 12 in the isolation regions. The gate wirings GL2 are formed of, for example, low-resistance polycrystalline silicon, and are formed integrally with and electrically connected with the above-mentioned gate electrodes 9E. The gate wirings GL2 and the gate electrodes 9E are integrally connected through the lead-out trenches 5b formed in the main surface of the substrate 1A. (Refer to FIG. 7.) The gate wirings GL2 are electrically connected with the above-mentioned gate fingers GF1 and GF2 through the contact holes 15c formed in the interlayer insulating layer 12 in the isolation regions. The gate wirings GL2 are electrically connected with the gate pad GP therethrough. That is, the gate pad GP is electrically connected with the gate electrodes 9E through the gate fingers GF1 and GF2 and the gate wirings GL2.

A cutoff portion 19 extended in the second direction X is provided between adjacent ones of the above-mentioned multiple dummy gate electrodes 7E and gate electrodes 9E so that adjoining gate electrodes 9E and 9E are connected together. This cutoff portion 19 will be described later in relation to a second embodiment.

Description will be given to the structure of the above-mentioned dummy gate electrode with reference to FIG. 8 to FIG. 11.

Figure 8:
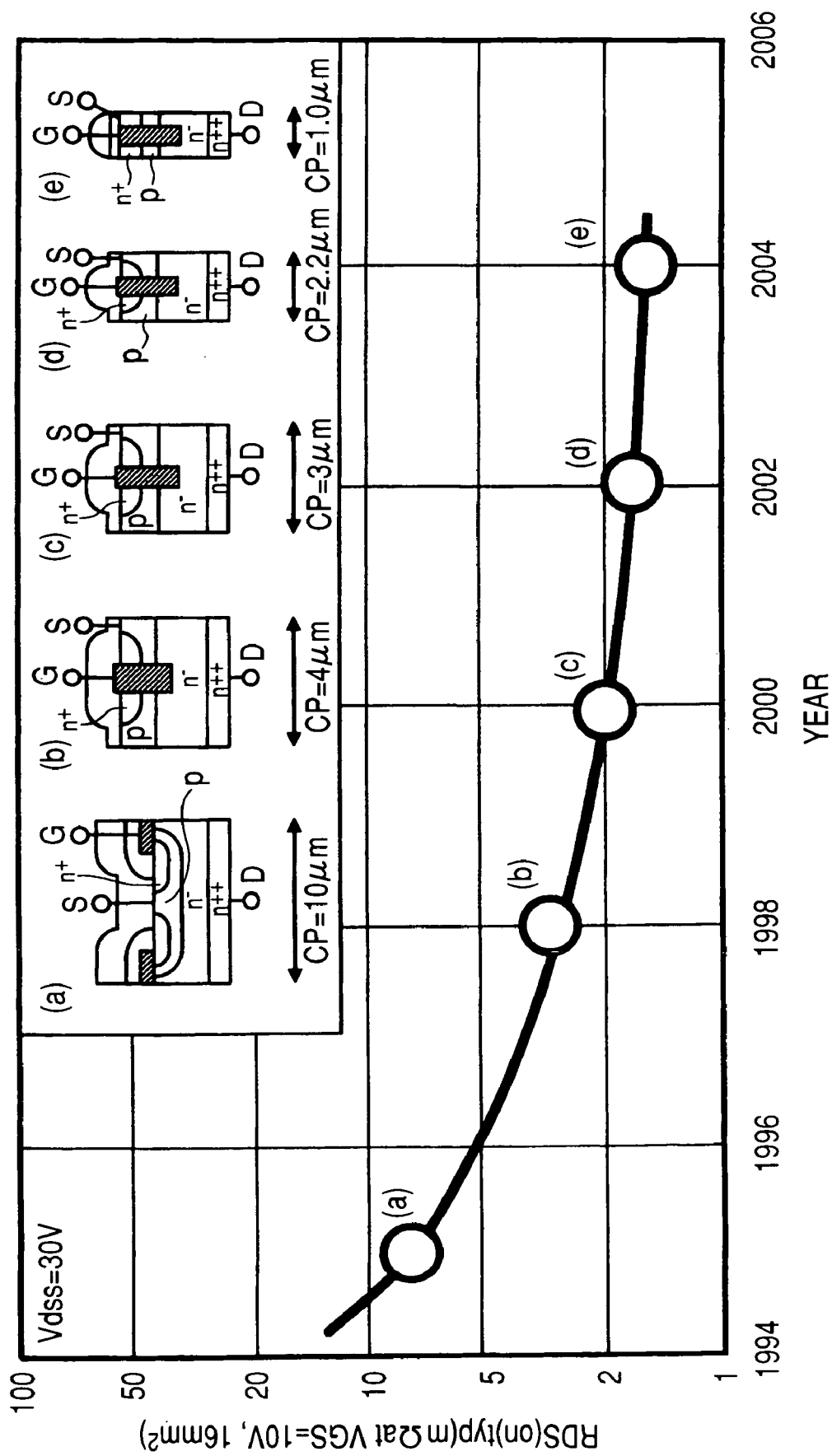
FIG. 8 is a graph chart illustrating the trends in the on-resistance and the cell pitch of power MIS-FETs.

One of the important performance indexes for power MIS-FETs is the resistance of a transistor observed when it is turned on (on-resistance). For a circuit through which a large current is passed, especially, it is required to reduce the on-resistance as much as possible for the purpose of reducing power loss as much as possible. To meet this requirement, the structure of power MIS-FETs has been being improved as illustrated in FIG. 8. FIG. 8 is a graph chart illustrating the trends in the on-resistance and the cell pitch CP of power MIS-FETs. More specific description will be given. Planar power MIS-FETs were replaced by those of the VDMIS-FET structure, illustrated under (a) in FIG. 8. Further, power MIS-FETs have been improved to those with a trench gate structure, low in parasitic resistance and high in gate density per unit area, as illustrated under (b) to (e) in FIG. 8. Thus, with respect to power MIS-FETs, the cell density and the performance have been enhanced by further microminiaturization of their structure.

Figure 9:
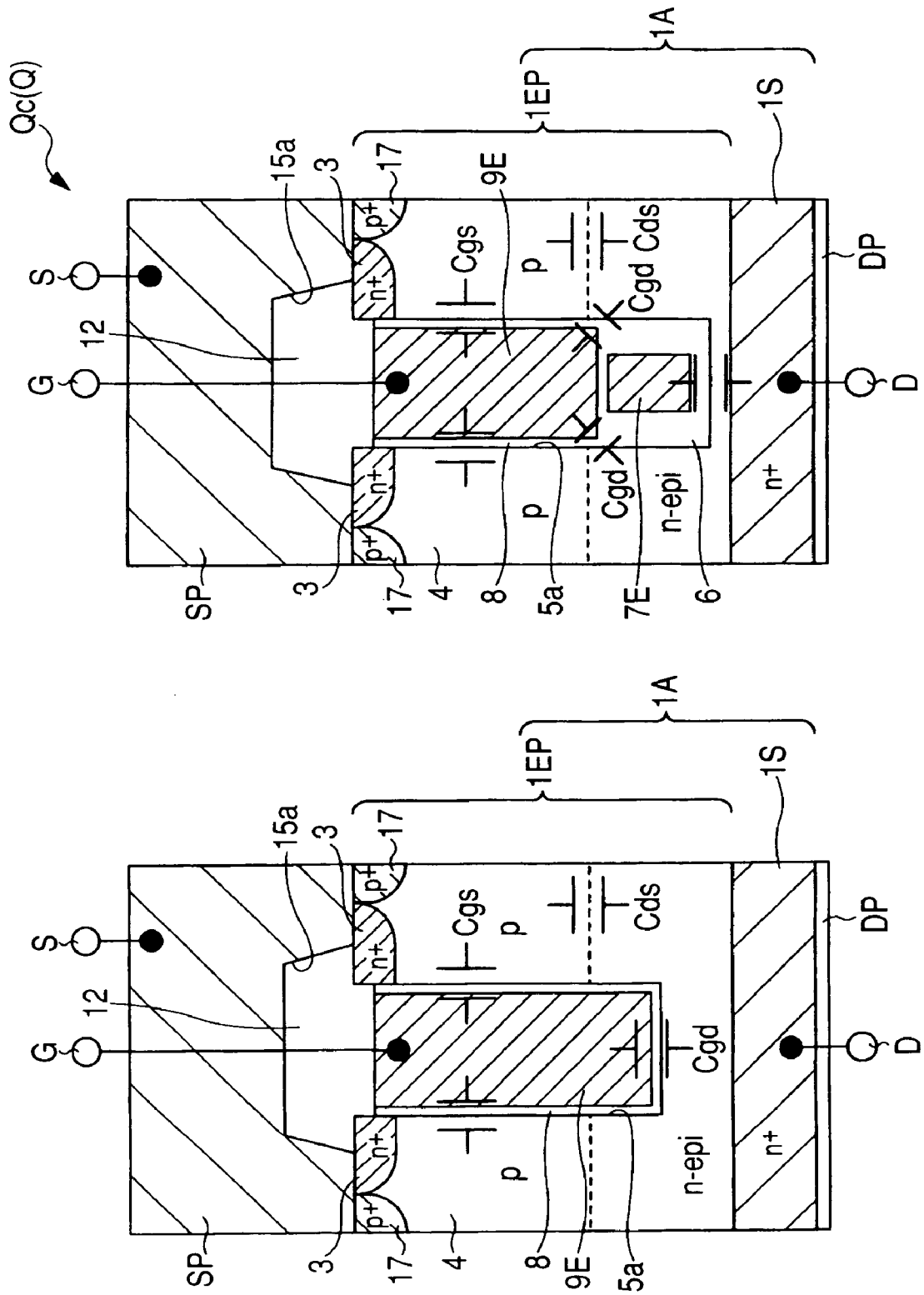
FIG. 9 is an explanatory drawing that compares a power MIS-FET cell without a dummy gate structure, on the left, with a power MIS-FET cell with a dummy gate structure, on the right, for capacitive component between terminals.
Figure 10:
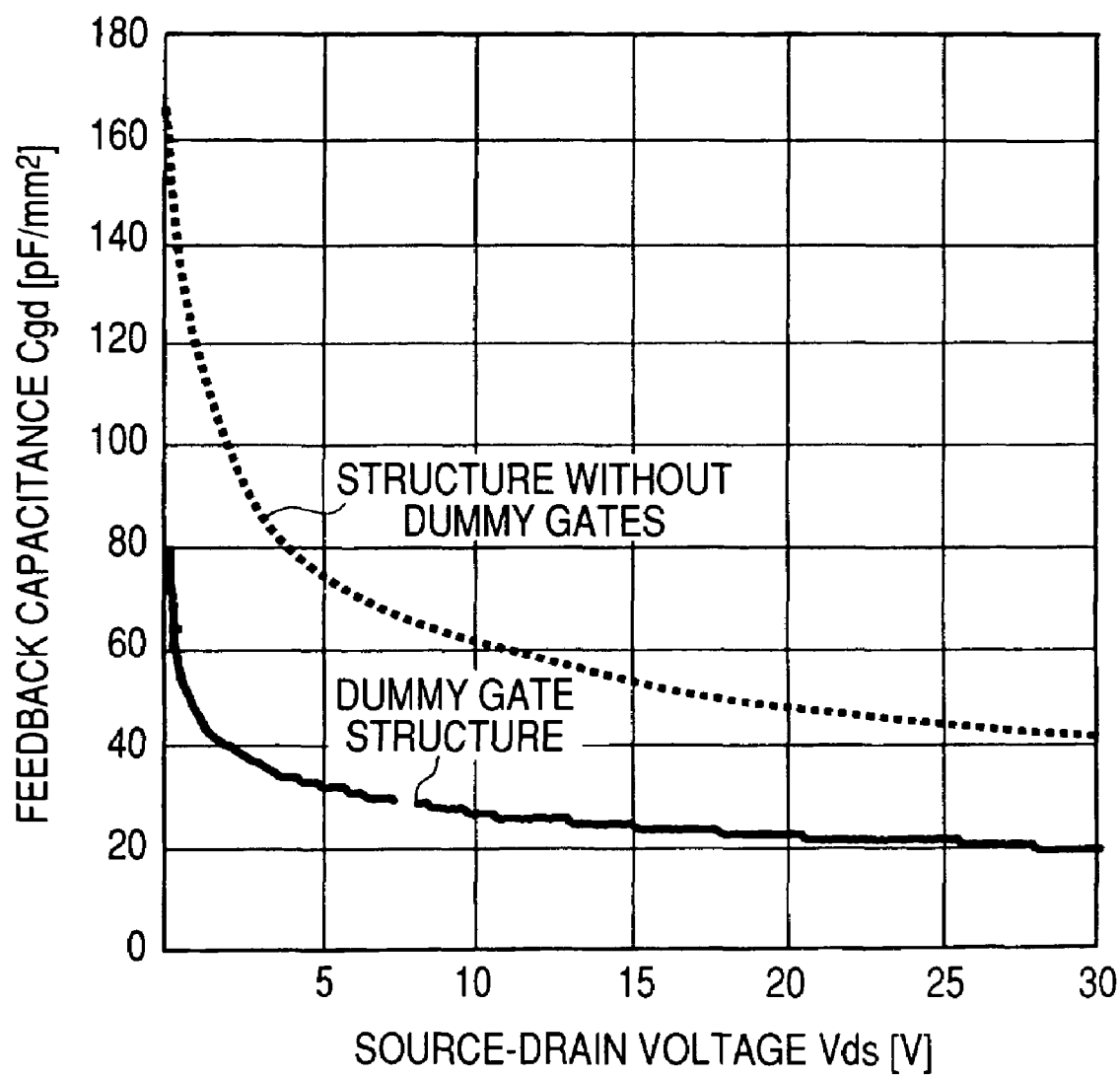
FIG. 10 is a graph chart that compares the power MIS-FETs on the left and right in FIG. 9 for dependence on feedback capacitance-drain voltage.

When the cell density is increased, the on-resistance is reduced but the input capacitance of the device itself is increased. In addition, the parasitic capacitance between gate and drain also becomes nonnegligible in magnitude. This lowers the switching speed of the power MIS-FET. To cope with this, shield electrodes (dummy gate electrodes 7E) were provided between the gate electrodes 9E and the drain pad DP. FIG. 9 is an explanatory drawing that compares a power MIS-FET cell without a dummy gate structure, on the left, with a power MIS-FET cell with a dummy gate structure, on the right, with respect to capacitive component between terminals. The dummy gate structure shown on the right in FIG. 9 is effective especially in reducing the gate-drain capacitance (feedback capacitance) Cgd. FIG. 10 is a graph chart that compares the power MIS-FETs on the left and right in FIG. 9 for dependence on feedback capacitance-drain voltage. As illustrated in FIG. 10, the parasitic capacitance Cgd can be reduced to approximately ⅓ as compared with the power MIS-FET without the dummy gate electrode 7E on the left in FIG. 9. As a result, in a power MIS-FET with a dummy gate structure, higher-speed switching can be accomplished as compared with power MIS-FETs without a dummy gate structure.

Figure 11:
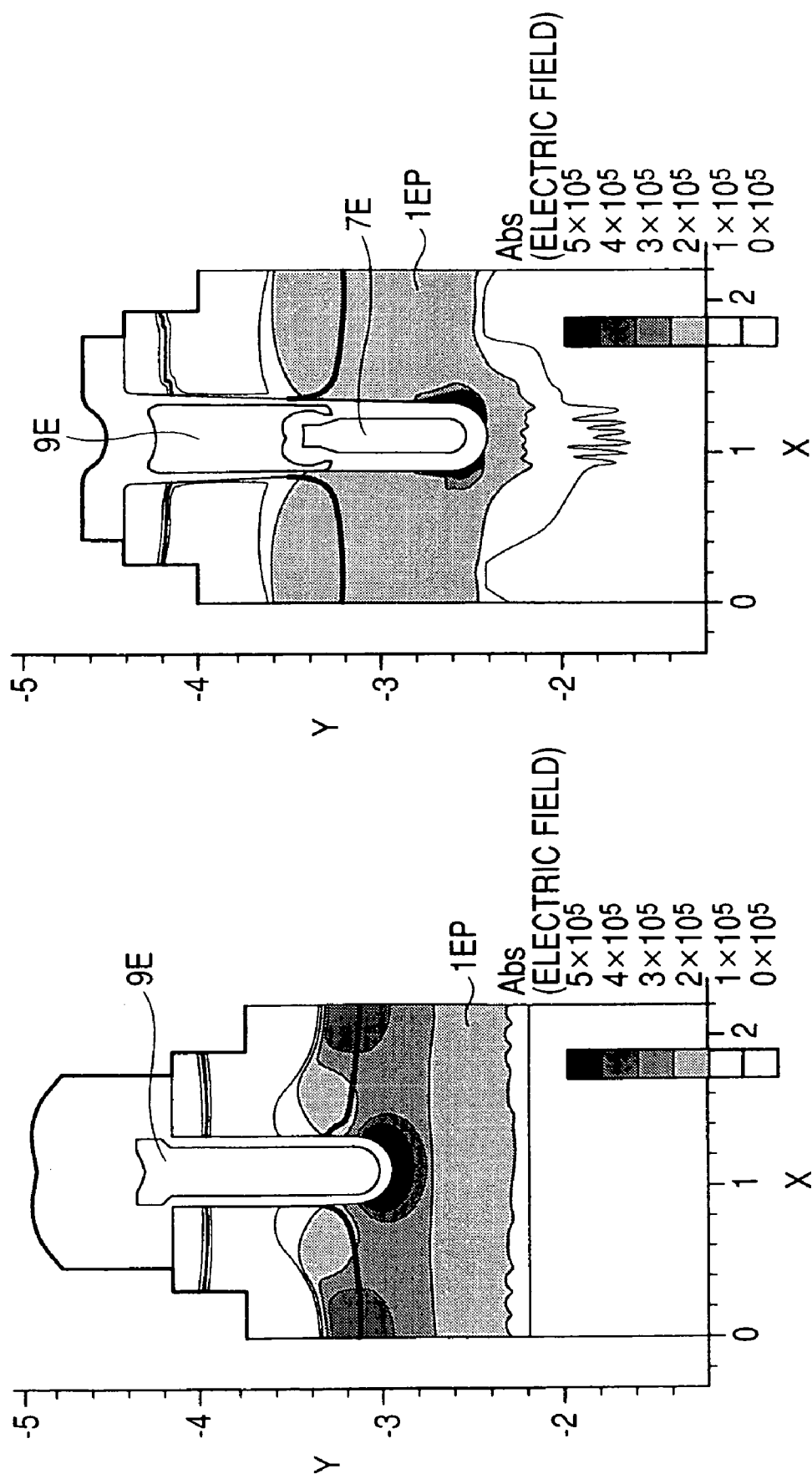
FIG. 11 is an explanatory drawing schematically illustrating the results of simulation on the power MIS-FET cell without a dummy gate structure, on the left, and the power MIS-FET cell with a dummy gate structure, on the right. This simulation was carried out with respect to the distribution of electric field strength in these devices.

With a dummy gate structure, in addition, the resistance of the high-resistance layer (drift layer) of a drain can be made lower than structures without dummy gate electrodes, illustrated on the left in FIG. 9. FIG. 11 is an explanatory drawing schematically illustrating the results of simulation on a power MIS-FET cell without a dummy gate structure, on the left, and a power MIS-FET cell with a dummy gate structure, on the right. This simulation was carried out with respect to the distribution of electric field strength in these devices. Without a dummy gate structure, as shown on the left in FIG. 11, the electric field strength becomes highest at the bottom of the trench 5a when voltage is applied to between source and drain. Therefore, the dielectric withstand voltage between source and drain of the power MIS-FET is equivalent to a voltage at which avalanche breakdown occurs at the side faces of the gate electrodes 9E. When an avalanche current flows on the side face of a gate electrode 9E, the gate electrode 9E is immediately destroyed. To prevent a power MIS-FET from being immediately destroyed even if it yields, it is required to take the following measure in a case where no dummy gate structure is provided, illustrated on the left in FIG. 11: a portion of low withstand voltage is intentionally formed in a place away from a gate in a device, for example, directly under the $p^+$-type semiconductor region 17 so as to prevent avalanche breakdown from occurring on the side faces of the gate electrodes 9E. For this reason, the withstand voltage of the device is lowered relative to the dielectric withstand voltage that is determined by the resistivity of the epitaxial layer 1EP. In a case where a dummy gate structure is provided, meanwhile, the electric fields at the side faces of the gate electrodes 9E are weakened by the electric field reduction effect (RESURF) by the dummy gate electrodes 7E. As a result, avalanche breakdown can be made less prone to occur at the side faces of the gate electrodes 9E. For this reason, the withstand voltage need not be intentionally lowered, unlike cases where no dummy gate structure is provided. Therefore, the withstand voltage of the epitaxial layer 1EP is equal to the withstand voltage of the device. That is, a high withstand voltage can be ensured by the electric field reduction effect by the dummy gate electrodes 7E; therefore, the impurity concentration of the epitaxial layer 1EP can be enhanced, and thus the on-resistance can be reduced.

Description will be given to the configuration and effect of a power MIS-FET Q in the first embodiment with reference to FIGS. 12(a) and 12(b).

As mentioned above, low-resistance power MIS-FETs have been already on their way to be implemented. However, the present inventors found that elements of parasitic resistance, to which importance had not been attached until then, would pose major problems. One of the problems is the contact resistance of source contacts (the areas of contact between the source pads SP and the semiconductor regions 3 for source). FIGS. 12(a) and 12(b) are explanatory drawings respectively illustrating the configuration of a power MIS-FET considered by the present inventors and the configuration of a power MIS-FET in the first embodiment by comparison.

Figure 12:
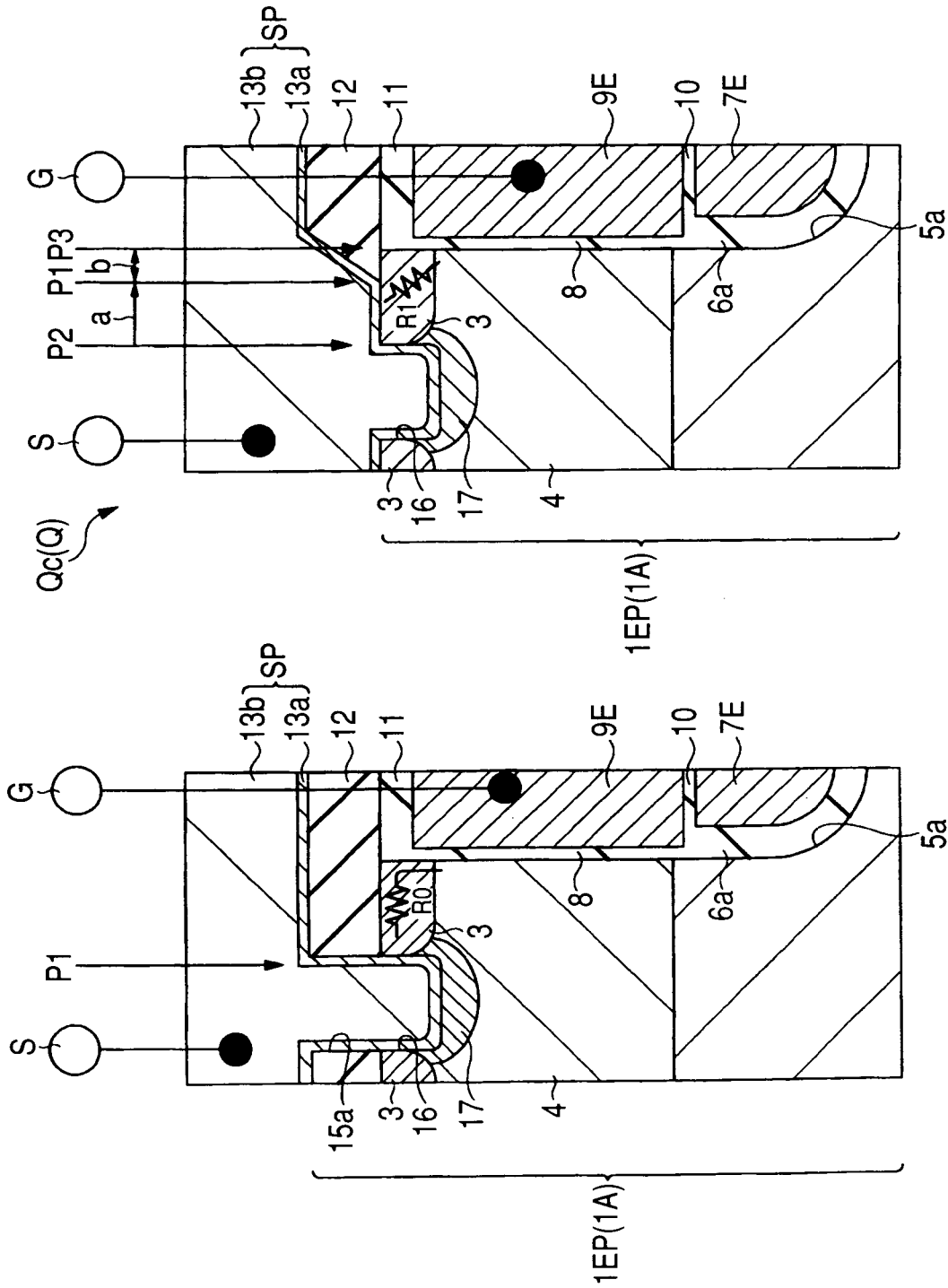
FIGS. 12(a) and 12(b) are explanatory drawings respectively illustrating the configuration of a power MIS-FET considered by the present inventors and the configuration of a power MIS-FET in a first embodiment of the present invention by comparison.

As illustrated in FIGS. 12(a) and 12(b), in power MIS-FETs, the following construction is adopted to lower the contact resistance of a body (semiconductor region 4 for channel formation) to prevent parasitic bipolar operation: the trenches 16 are provided in the main surface of the substrate 1A, and the areas of contact between the source pads SP and the semiconductor region 4 for channel formation are dug down. In a case where the interlayer insulating layer 12 covers the entire upper faces of the semiconductor regions 3 for source like the construction illustrated in FIG. 12(a), the metal of the source pads SP and the semiconductor regions 3 for source are brought into contact with each other at the side faces of the trenches 16. However, the impurity concentration of the semiconductor regions 3 for source is highest at the upper faces and low at the side faces. This increases the resistance of contact between the source pads SP and the semiconductor regions 3 for source.

Consequently, the first embodiment is so constructed that the upper faces of the semiconductor regions 3 for source are largely exposed by taking the following measure, as mentioned above (as illustrated in FIG. 12(b)): an end of the interlayer insulating layer 12 is backed off in the direction in which it recedes away from the trenches 16 (that is, in the direction in which it goes toward the gate electrodes 9E.) Thus, the contact area of the portions of contact between the source pads SP and the semiconductor regions 3 for source (the upper faces of the semiconductor regions 3 for source and the side faces of the trenches 16) can be increased. Therefore, its contact resistance can be reduced. In case of the construction illustrated in FIG. 12(b), an end (position P1) of the interlayer insulating layer 12) is backed off toward the gate electrodes 9E. Thus, the distance between the source pads SP and the semiconductor region 4 for channel formation can be shortened. For this reason, in case of the construction illustrated in FIG. 12(b), the following can be implemented: the resistance R1 between the source pads SP and the semiconductor region 4 for channel formation can be made lower than the resistance R0 between the source pads SP and the semiconductor region 4 for channel formation in the construction illustrated in FIG. 12(a). The on-resistance of a power MIS-FET Q can be reduced by the above-mentioned means.

One of other configurations of the power MIS-FET is such that the upper parts of the gate electrode 9E are protruded above the main surface of the substrate 1A. In this case, a danger is posed when an end of the interlayer insulating layer 12 is backed off toward the gate electrodes 9E to increase the area of exposure of the upper faces of the semiconductor regions 3 for source, as in the first embodiment. The insulating layer between the source pads SP and the gate electrodes 9E may be excessively thinned. To cope with this, in the first embodiment, the upper faces of the gate electrodes 9E are sunken to a level lower than the main surface of the substrate 1A (recess structure). Thus, an end of the interlayer insulating layer 12 can be backed off toward the gate electrodes 9E to largely expose the upper faces of the semiconductor regions 3 for source without posing the above-mentioned danger. Specifically, the first embodiment is so constructed that b≦a or b=0 (zero), where a is the above-mentioned distance (exposed length); and b is the above-mentioned length (overlap length or covering length). With this construction, the on-resistance is most reduced. As mentioned above, the gate electrodes 9E are of recess structure, and the above-mentioned danger can be reduced. Therefore, position P1, or the position of the end of the interlayer insulating layer 12 may be located above the upper face of a gate electrode 9E.

Figure 13:
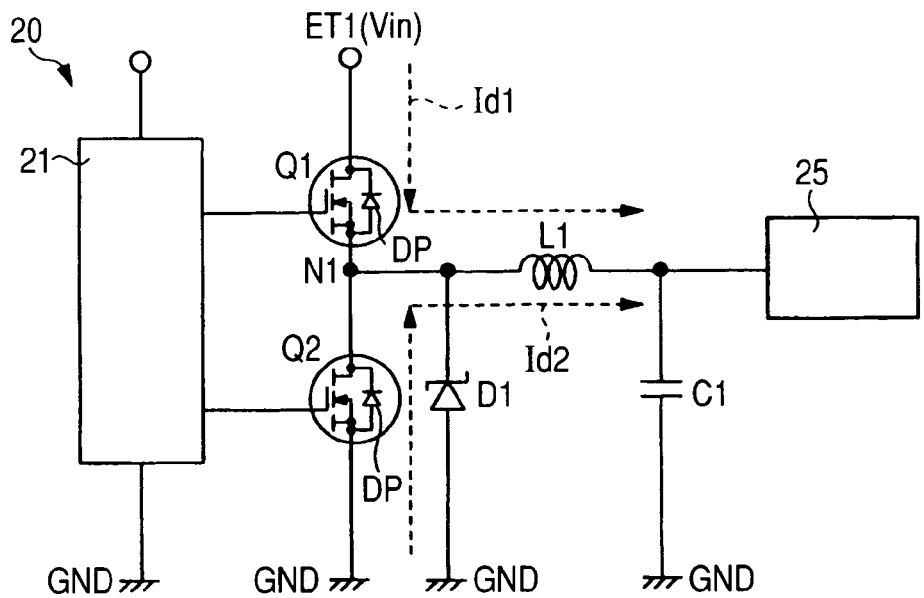
FIG. 13 is a circuit diagram of an example of a non-isolated DC-DC converter constructed using a power MIS-FET in an embodiment of the present invention.

Description will be given to an example of a circuit constructed using a power MIS-FET Q in the first embodiment. FIG. 13 illustrates an example of a non-isolated DC-DC converter 20 constructed using a power MIS-FET Q in the first embodiment. This non-isolated DC-DC converter 20 is a power supply conversion circuit for use in a power supply circuit for electronic equipment, such as desktop-type personal computers, note-type personal computers, servers, game machines, and the like. The DC-DC converter includes such elements as a control circuit 21, power MIS-FETs (first and second field-effect transistors) Q1 and Q2, SBD (Schottky Barrier Diode) D1, a coil L1, a capacitor C1, and the like.

The control circuit 21 is a circuit, such as a pulse width modulation (PWM) circuit, that supplies signals for controlling the width of switch-on of voltage for the power MIS-FETs Q1 and Q2 (on-time). The output (terminals for control signals) of this control circuit 21 is electrically connected with the gates of the power MIS-FETs Q1 and Q2 through a driver circuits. The driver circuits are circuits that respectively control the potential of the gates of the power MIS-FETs Q1 and Q2 and thereby control the operation of the power MIS-FETs Q1 and Q2 according to control signals supplied from the control circuit 21. The driver circuits are formed of, for example, CMOS inverter circuits.

The power MIS-FETs Q1 and Q2 are connected in series between a terminal (first power supply terminal) ET1 for supplying power supply potential (first power supply potential) Vin for input and a terminal (second power supply terminal) for supplying reference potential (second power supply potential) GND. That is, the power MIS-FET Q1 is provided so that its source-drain path is connected in series between the terminal ET1 and an output node (output terminal) N1. The power MIS-FET Q2 is provided so that its source-drain path is connected in series between the output node N1 and the terminal for supplying ground potential GND. The configuration of these power MIS-FETs Q1 and Q2 is the same as the configuration of the above-mentioned power MIS-FET Q in the first embodiment. The input power supply potential Vin is, for example, 5 to 12V or so. The reference potential GND is, for example, a power supply potential lower than the power supply potential for input, and it is, for example, ground potential of 0 (zero) V. The operating frequency (cycle with which the power MIS-FETs Q1 and Q2 are turned on and off) of the non-isolated DC-DC converter 20 is, for example, 1 MHz or so.

The power MIS-FET Q1 is a power transistor for high-side switch (high potential side: first operating voltage). It has a switch function for storing energy in the coil L1 that supplies power to the output of the non-isolated DC-DC converter 20 (the input of a load circuit 25). This power MIS-FET Q1 is formed of a vertical field-effect transistor whose channel is formed in the direction of the thickness of the chip. According to the consideration by the present inventors, the following occurs in the power MIS-FET Q1 for high-side switch: because of the parasitic capacitance added thereto, the switching loss (turn-on loss and turn-off loss) comes to look large as the operating frequency of the non-isolated DC-DC converter 20 is enhanced. In normal circumstances, therefore, it is preferable that the following measure should be taken with the switching loss taken into account: a horizontal field-effect transistor in which a channel is formed along the main surface of the chip (the plane orthogonal to the direction of the thickness of the chip) is applied as the field-effect transistor for high-side switch. The reason for this is as follows: in a horizontal field-effect transistor, the area of overlap between a gate electrode and a drain region is smaller than in vertical field-effect transistors; therefore, the parasitic capacitance (gate parasitic capacitance) added to between gate and drain can be reduced. However, when an attempt is made to make a value of resistance (on-resistance), produced when a horizontal field-effect transistor operates, substantially equal to that in vertical field-effect transistors, a problem arises. The cell area of the horizontal field-effect transistor must be increased to so large a value as approximately 2.5 or more times the cell area of a vertical field-effect transistor. This is disadvantageous for downsizing of elements. In case of vertical field-effect transistor, meanwhile, the channel width per unit area can be increased as compared with horizontal field-effect transistors, and thus the on-resistance can be reduced. That is, downsizing of elements can be achieved and the packaging can be reduced in size by forming the power MIS-FET Q1 for high-side switch of a vertical field-effect transistor.

Figure 14:
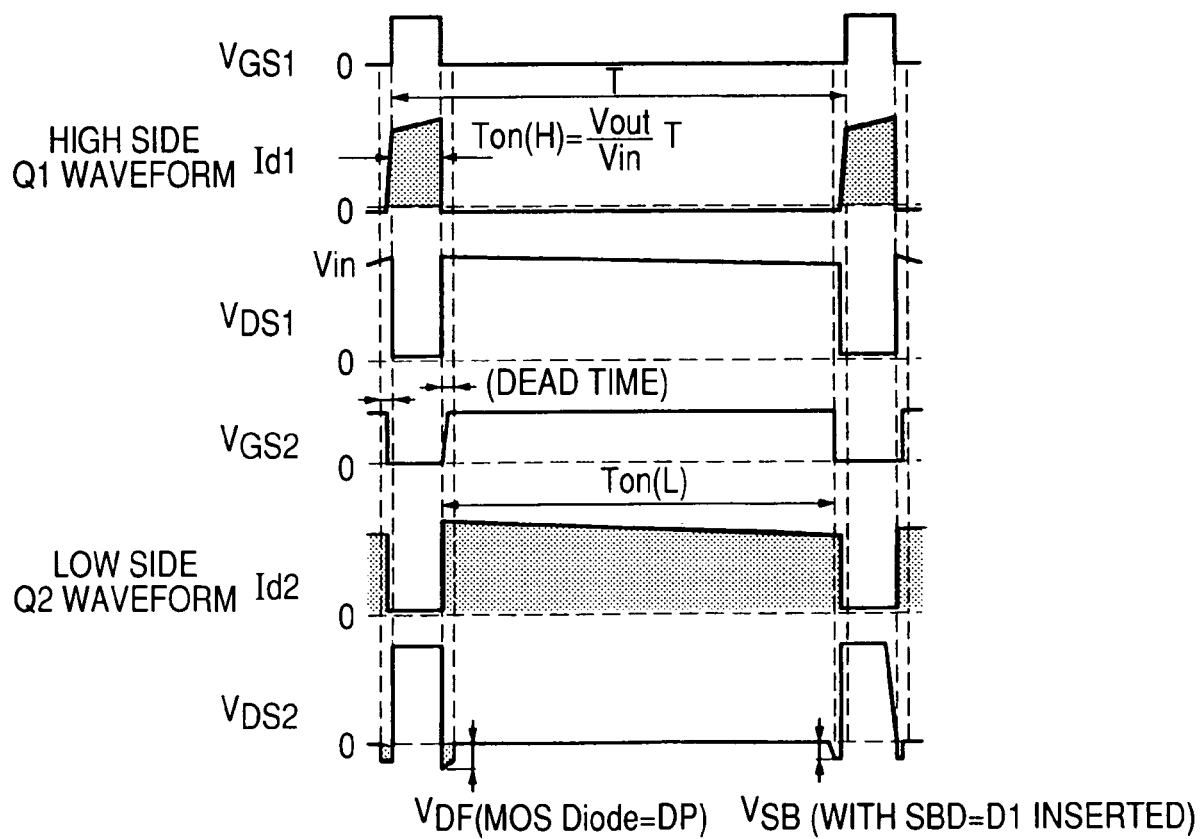
FIG. 14 is a timing diagram of an example of the non-isolated DC-DC converter in FIG. 13.

The power MIS-FET Q2 is a power transistor for low-side switch (low potential side: second operating voltage), and is the transistor for rectification of the non-isolated DC-DC converter 20. The power MIS-FET Q2 has a function of lowering the resistance of the transistor in synchronization with a frequency from the control circuit 21 to carry out rectification. Like the power MIS-FET Q1, this power MIS-FET Q2 is formed of a vertical power MIS-FET in which a channel is formed in the direction of the thickness of the chip. This is because of the following, for example: FIG. 14 illustrates an example of the timing diagram of the non-isolated DC-DC converter 20. Code Ton denotes the pulse width observed when the power MIS-FET Q1 for high-side switch is on, and T denotes pulse frequency. As illustrated in FIG. 14, the on-time (duration for which voltage is applied) of the power MIS-FET Q2 for low side is longer than the on-time of the power MIS-FET Q1 for high-side switch. For this reason, in the power MIS-FET Q2, the loss due to on-resistance comes to look larger than the switching loss. Therefore, application of a vertical field-effect transistor in which the channel width per unit area can be increased as compared with horizontal field-effect transistors is advantageous. That is, the on-resistance can be reduced by forming the power MIS-FET Q2 for low-side switch of a vertical field-effect transistor. Therefore, the voltage conversion efficiency can be enhanced even when the current passed through the non-isolated DC-DC converter 20 is increased. In FIG. 14, code VGS1 denotes the gate-source voltage of the power MIS-FET Q1; Id1 denotes the drain current (channel current) of the power MIS-FET Q1; VDS1 denotes the source-drain voltage of the power MIS-FET Q1; VGS2 denotes the gate-source voltage of the power MIS-FET Q2; Id2 denotes the drain current (channel current) of the power MIS-FET Q2; and VDS2 denotes the source-drain voltage of the power MIS-FET Q2.

The above-mentioned output node N1 is provided in the wiring connecting the source of the power MIS-FET Q1 and the drain of the power MIS-FET Q2 in the non-isolated DC-DC converter 20 in FIG. 13. This output node is for supplying power supply potential for output to the outside. The output node N1 is electrically connected with the coil L1 through output wiring, and further electrically connected with the load circuit 25 through output wiring.

Between the output wiring that connects the output node N1 and the coil L1 and the terminal for supplying reference potential GND, the above-mentioned SBD D1 is electrically connected in parallel with the power MIS-FET Q2. This SBD D1 is a diode whose forward voltage Vf is lower than that of the parasitic diode Dp of the power MIS-FET Q2. The anode of the SBD D1 is electrically connected with the terminal for supplying reference potential GND, and its cathode is electrically connected with the output wiring that connects the coil 1 and the output node N1. The following can be implemented by connecting the SBD D1 as mentioned above: voltage drop during the dead time when the power MIS-FET Q2 is turned off (Refer to FIG. 14.) can be reduced, and the conduction loss of the diode can be reduced; the reverse recovery time (trr) can be enhanced, and thus the recovery loss of the diode can be reduced.

Between the output wiring that connects the coil L1 and the load circuit 25 and the terminal for supplying reference potential GND, the above-mentioned capacitor C1 is electrically connected. Examples of the load circuit 25 include the CPU (Central Processing Unit), the DSP (Digital Signal Processor), or the like of the above-mentioned electronic equipment.

In such a non-isolated DC-DC converter 20, supply voltage is converted by alternately turning on and off the power MIS-FETs Q1 and Q2 in synchronization. More specific description will be given. When the power MIS-FET Q1 for high-side switch is on, a drain current (first current) Id1 is passed from the terminal ET1 electrically connected with the drain of the power MIS-FET Q1 to the output node N1 through the power MIS-FET Q1. When the power MIS-FET Q1 for high-side switch is off, a drain current Id2 is passed by the counterelectromotive voltage of the coil L1. Voltage drop can be reduced by turning on the power MIS-FET Q2 for low-side switch when this drain current Id2 is being passed. The above-mentioned drain current Id1 is a large current of, for example, 20A or so.

Of the losses in such a non-isolated DC-DC converter 20, the on-resistance loss is largest, followed by the switching loss, drive loss, dead time diode loss, and other losses in this order. Therefore, reduction of the on-resistance greatly contributes to the enhancement of efficiency. The first embodiment makes it possible to reduce the on-resistance by taking the following measure as mentioned above: the structure of the power MIS-FET Q in the first embodiment is adopted for the power MIS-FETs Q1 and Q2 of the non-isolated DC-DC converter 20. As a result, the voltage conversion efficiency of the non-isolated DC-DC converter 20 can be enhanced.

Second Embodiment

Description will be given to the above-mentioned cutoff portion 19 in relation to a second embodiment. The configuration of the chip 1 is the same as described with respect to the first embodiment with reference to FIG. 1 to FIG. 7. In the following description of the second embodiment, the same members as described with respect to the first embodiment will be marked with the same numerals or codes.

Figure 15:
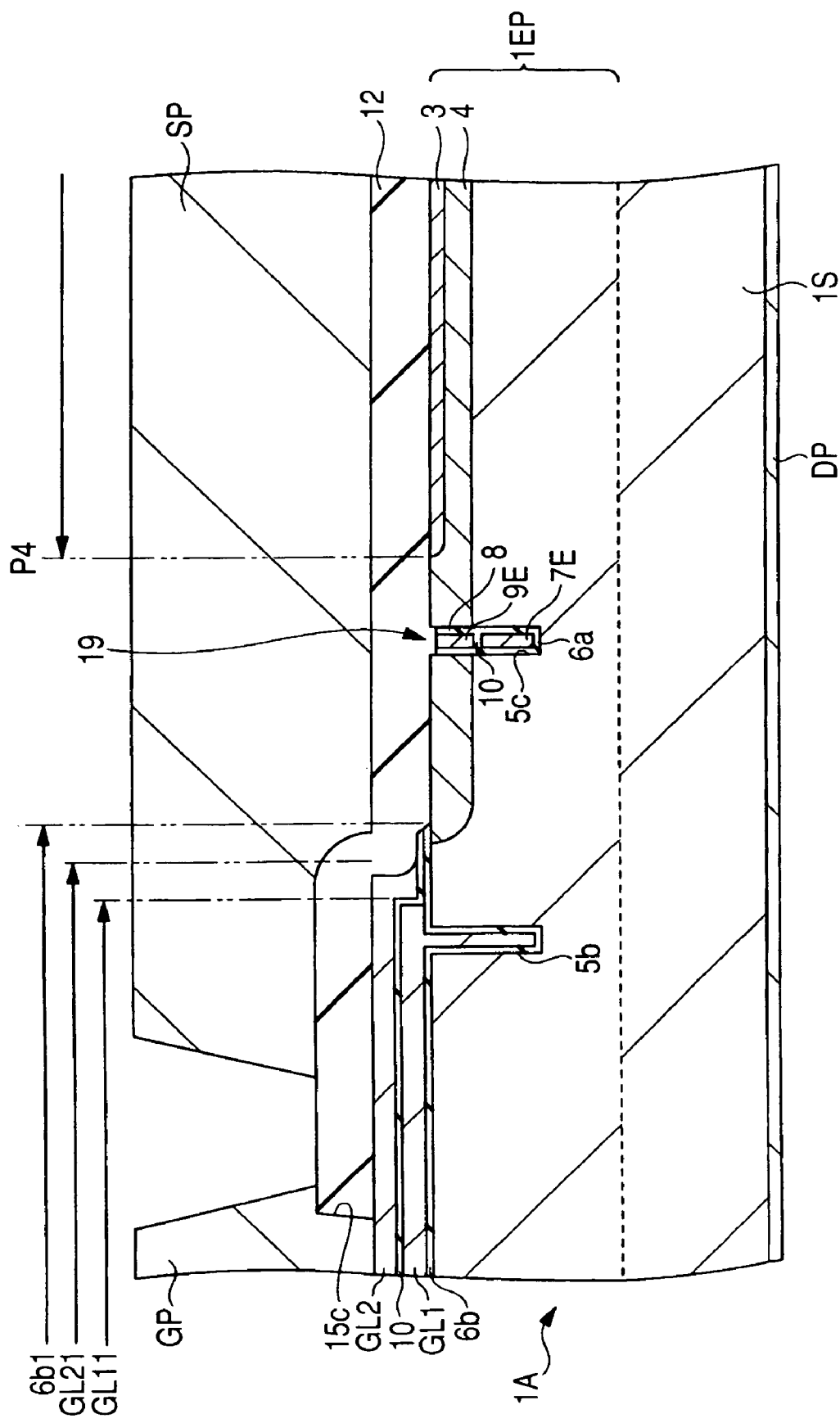
FIG. 15 is a sectional view taken along line Y2-Y2 of FIG. 3.

FIG. 15 is a sectional view taken along line Y2-Y2 of FIG. 3. The second embodiment is provided with a cutoff portion 19. It is positioned between an end of a semiconductor region 3 for source on the periphery of a group of the multiple cells Qc of the power MIS-FET Q (position P4) and an end 6b1 of an insulating layer 6b for isolation provided outside of the end (position P4) of the semiconductor region 3 for source. The cutoff portions 19 are provided between adjoining gate electrodes 9E so that they are extended in the second direction X and intersect the gate electrodes 9E at right angles. The cutoff portions 19 adjoining in the second direction X are arranged in a staggered pattern. That is, the cutoff portions 19 adjoining in the second direction X are disposed so that they are shifted in the first direction Y. The reason why the cutoff portions 19 are not arranged in a linear pattern is as follows: in a case where the cutoff portions 19 are arranged in a linear pattern, portions where a cutoff portion 19 and a gate electrode 9E intersect each other in the shape of a cross. The distance of the center of this intersection from a side face of a trench is longer than the distance from a side face of a trench to the center of the trench in another portion of the stripe. In a process in which the gate electrodes 7E and 9E are formed in the trenches (a process in which polycrystalline silicon is deposited by CVD), polycrystalline silicon is deposited at uniform speed in every direction on the surface of the substrate 1A (semiconductor wafer), including the side faces of the trenches. Therefore, even when the striped portion is completely filled with polycrystalline silicon, there is a possibility that polycrystalline silicon is not completely filled in the centers of the above-mentioned intersections. When the cutoff portions 19 are arranged in a staggered pattern, as mentioned above, the distance between the side faces of the trenches and the centers of the intersections becomes shorter as compared with cases where they are arranged in a linear pattern. Therefore, the possibility that polycrystalline silicon is not filled can be reduced.

The sectional structure of the cutoff portions 19 is the same as the configuration of the gate portions of the cells Qc of the above-mentioned power MIS-FET Q. That is, the cutoff portions 19 have the dummy gate electrodes 7E and the gate electrodes 9E in cutoff trenches 5c orthogonal to the main surface of the substrate 1A via the gate insulating layers 6a and 8. The depth of the cutoff trenches 5c are the same as the depth of the trenches 5a in the gate portion. That is, the depth is such that the trenches 5c penetrate the semiconductor region 4 for channel formation and are terminated at the epitaxial layer 1EP for drain. The dummy gate electrodes 7E and the gate electrodes 9E in the cutoff portions 19 are electrically separated from each other by the insulating layer 10. The dummy gate electrodes 7E in the cutoff portions 19 are formed of, for example, low-resistance polycrystalline silicon. They are formed integrally with and electrically connected with the dummy gate electrodes 7E of the cells Qc, and are supplied with source potential. The gate electrodes 9E in the cutoff portions 19 are formed of, for example, low-resistance polycrystalline silicon. They are formed integrally with and electrically connected with the gate electrodes 9E of the cells Qc, and are supplied with voltage for controlling the operation of the power MIS-FET Q.

Description will be given to the effects of such a cutoff portion 19. Another important point with respect to the power MIS-FET is the reliability of devices. Since large voltage is applied to between the source and the drain of a power MIS-FET, a minor defect can completely destroy the device.

Figure 16:
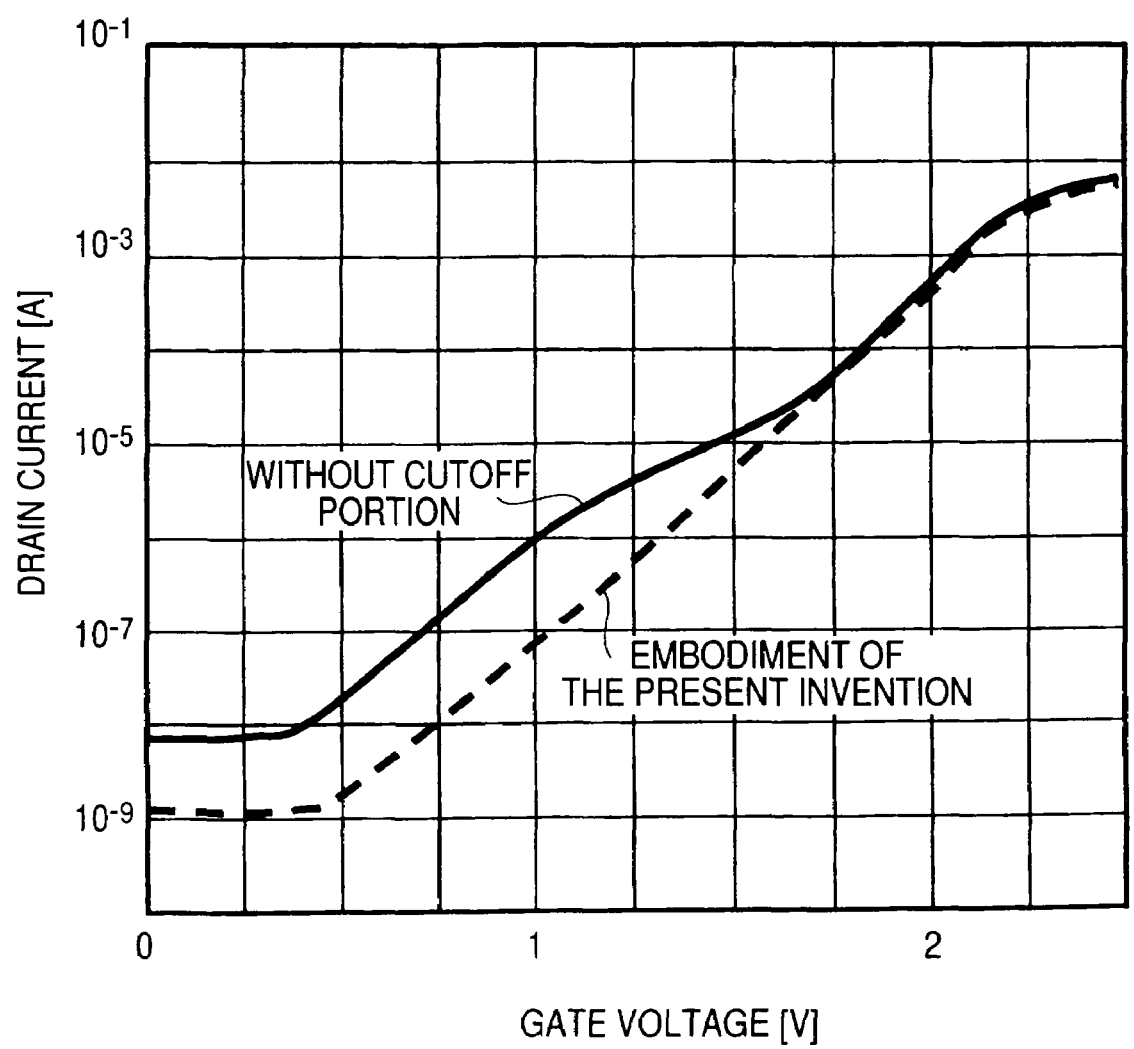
FIG. 16 is a graph chart illustrating the gate voltage-drain current characteristic of a power MIS-FET.
Figure 17:
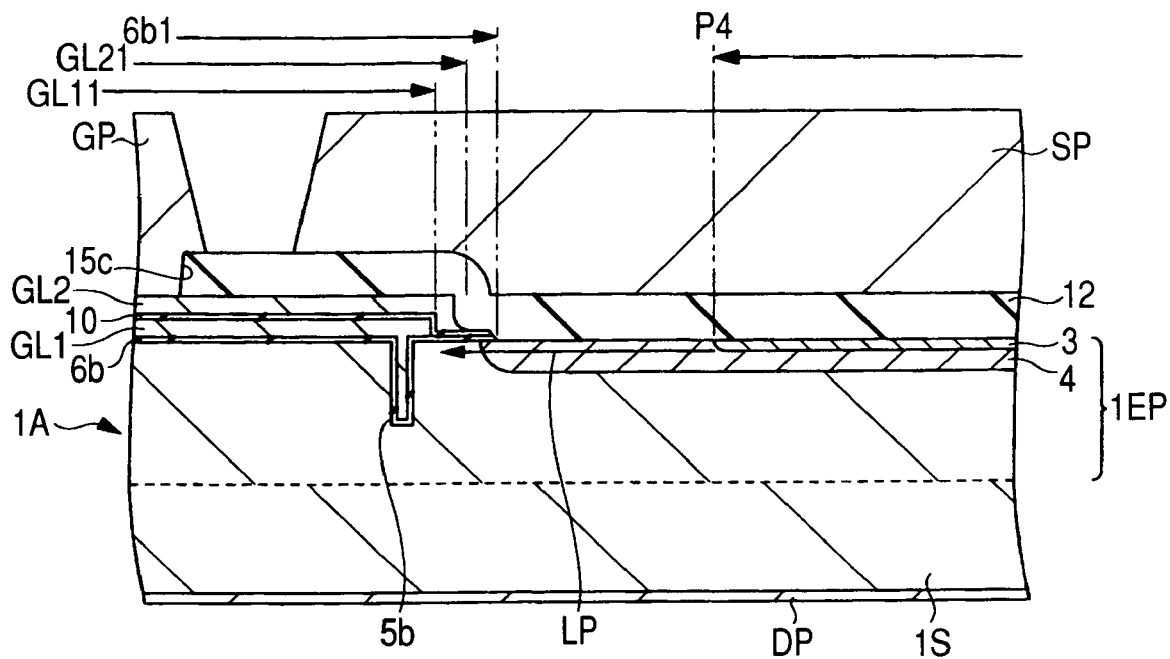
FIG. 17 is a sectional view of the portion of the semiconductor substrate in FIG. 3, corresponding to line Y2-Y2 for explaining a problem that arises without a cutoff portion.

FIG. 16 is a graph chart illustrating the gate voltage-drain current characteristic of a power MIS-FET. The solid line indicates a case where there is no cutoff portion, and the broken line indicates a case where there are cutoff portions 19. In case there is no cutoff portion (solid line), the current is increased in the subthreshold region, and a knobby characteristic curve is observed. This is probably because a parasitic MIS-FET between source and drain (substrate 1A) is turned on at the peripheral part of the power MIS-FET. More specific description will be given. At the peripheral part of the power MIS-FET, the impurity concentration of the semiconductor region 4 for channel formation is prone to be lowered as compared with the central part of the device. As a result, the threshold value of the parasitic MIS-FET becomes lower than the threshold value of the device itself. FIG. 17 is a sectional view of the substrate 1A at the peripheral part corresponding to line Y2-Y2 of FIG. 3, and it is for explaining a problem that arises without a cutoff portion. The source of the parasitic MIS-FET is formed of the above-mentioned semiconductor regions 3 for source. The drain of the parasitic MIS-FET is formed of the above-mentioned substrate 1A (epitaxial layer 1EP) portion. The channel of the parasitic MIS-FET is formed in the superficial layer of the above-mentioned semiconductor region 4 for channel formation. The gate insulating film of the parasitic MIS-FET is formed of the above-mentioned interlayer insulating film 12. The gate electrode of the parasitic MIS-FET is formed of the above-mentioned source pads SP. At the peripheral part of the power MIS-FET, as mentioned above, the impurity concentration of the semiconductor region 4 for channel formation becomes lower as compared with the central part of the device; thus, the threshold value of the parasitic MIS-FET becomes lower than the threshold value of the device itself. As a result, a leakage current flows (a leakage path LP is formed) in the superficial layer of the main surface of the substrate 1A, as illustrated in FIG. 17. This leakage current flows from the semiconductor regions 3 for source toward the peripheral part, and breakdown may occur there.

Figure 18:
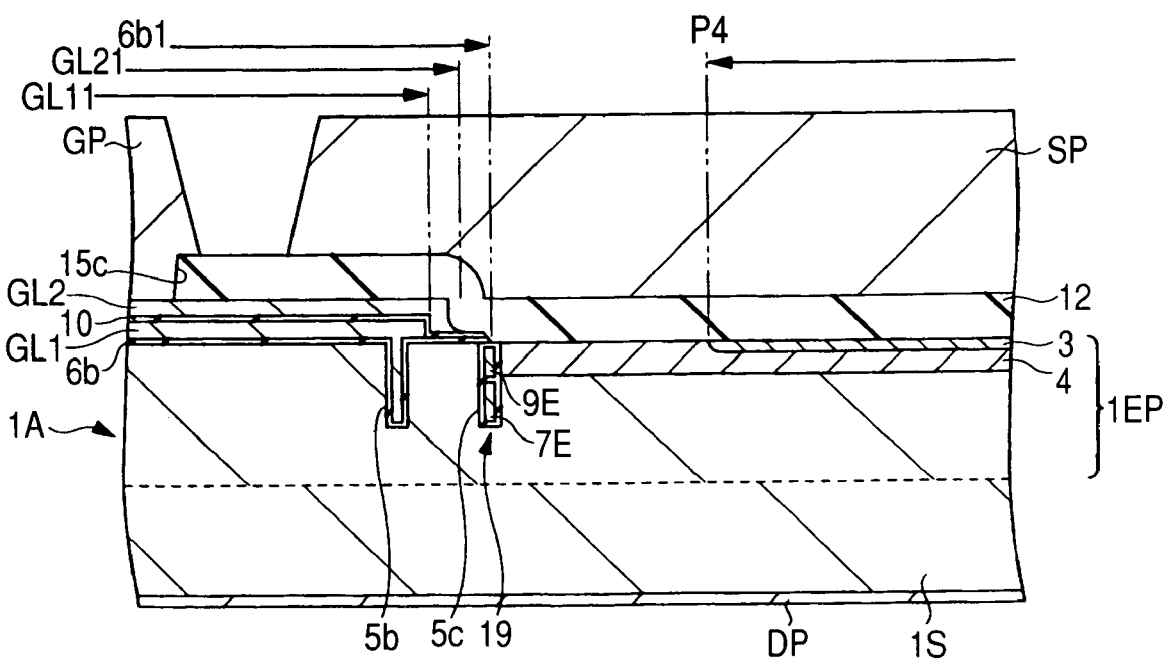
FIG. 18 is a sectional view of the portion of the semiconductor substrate in FIG. 3, corresponding to line Y2-Y2 for explaining a case where leakage can be blocked but there is another problem.
Figure 19:
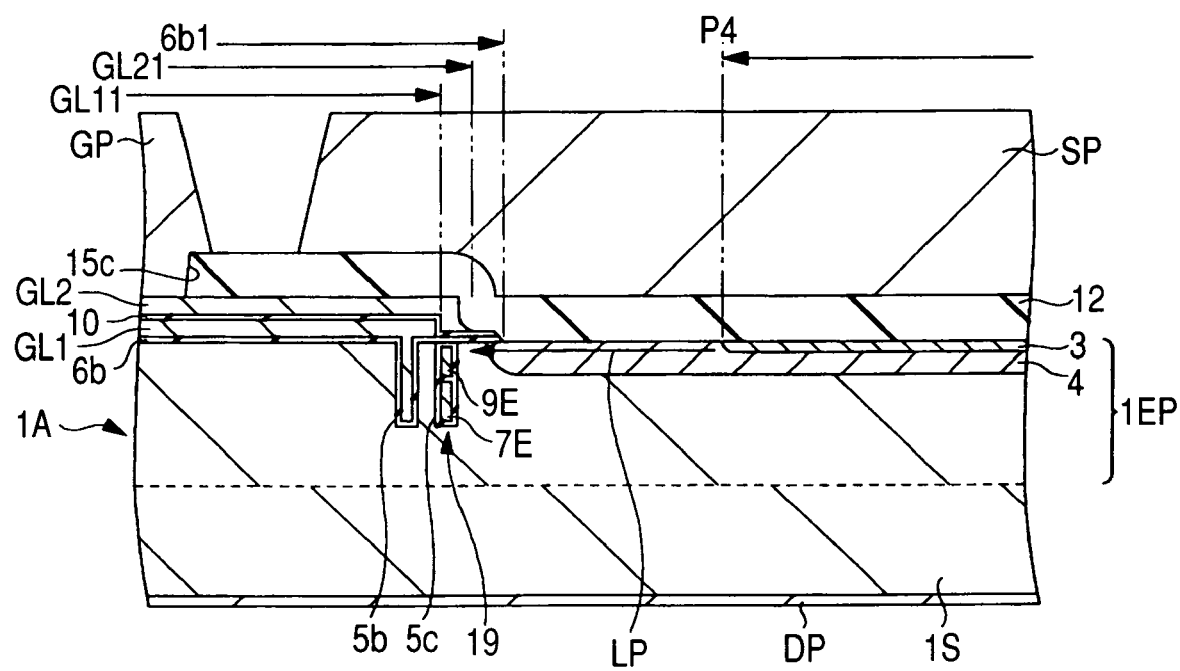
FIG. 19 is a sectional view of the portion of the semiconductor substrate in FIG. 3, corresponding to line Y2-Y2 for explaining a case where a cutoff portion is provided but leakage cannot be blocked.

To cope with this, the second embodiment is provided with the cutoff portions 19, as mentioned above. Even in a case where the cutoff portions 19 are provided so that their planar position agrees with the planar position of an end 6b1 of the insulating layer 6b, as illustrated in FIG. 18, the above-mentioned leakage path LP can be blocked off. However, this construction requires high aligning accuracy, and is not realistic. In a case where the cutoff portions 19 are provided outside an end of the semiconductor region 4 for channel formation, as illustrated in FIG. 19, the leakage path LP cannot be blocked off. That is, because of their functions, the cutoff portions 19 must be located outside the semiconductor regions 3 for source and in the semiconductor region 4 for channel formation. In case of dummy gate structure, the impurity implantation region for channel formation is limited to the regions of the dummy gate electrodes 7E without the gate insulating layer 6a and the insulating layer 6b for isolation. Therefore, the cutoff portions 19 must be positioned between ends of the semiconductor regions 3 for source (position P4) and an end 6b1 of the insulating layer 6b for isolation, as illustrated in FIG. 15.

As mentioned above, the second embodiment makes it possible to obtain the following effect in addition to the effect obtained by the first embodiment: the cutoff portions 19 are provided between the ends of the semiconductor regions 3 for source (position P4) on the periphery of a group of the cells Qc of the power MIS-FET Q and an end 6b1 of the insulating layer 6b for isolation. As a result, a leakage current due to the parasitic MIS-FET can be blocked off at the peripheral part of a group of the cells Qc, and thus breakdown due to that leakage current can be prevented. Therefore, the reliability of the power MIS-FET Q can be enhanced. That is, a high-performance, reliable power MIS-FET can be provided.

Third Embodiment

With respect to a third embodiment, description will be given to an example of the manufacturing method for the power MIS-FET Q, described in relation to the first and second embodiments, with reference to FIG. 20 to FIG. 36. In FIG. 20 to FIG. 36, the left part shows the element formation region (region where a group of the cells Qc of the power MIS-FET Q are to be formed), and the right part shows the peripheral region (regions including the isolation regions).

First, a substrate 1A (a planar and circular semiconductor wafer in this stage), illustrated in FIG. 20, is prepared. This substrate is obtained by growing the epitaxial layer 1EP, composed of a high-resistance n-type silicon (Si) single crystal, over the substrate portion 1S composed of a low-resistance $n^+$-type silicon (Si) single crystal. Subsequently, an insulating layer 30 composed of, for example, silicon oxide is formed over the main surface of the substrate 1A (the upper face of the epitaxial layer 1EP). In this case, a silicon oxide film used; however, any other material, such as silicon nitride ($Si_3N_4$), may be used. Thereafter, a series of photolithography processes, including application of a photoresist (hereafter, simply referred to as "resist") film, exposure, and development, are carried out to form a resist pattern over the insulating layer 30. Thereafter, the insulating layer 30 is etched using the resist pattern as an etching mask, and then the resist pattern is removed. Thus, a pattern of the insulating layer 30 for trench formation is formed over the main surface of the substrate 1A, as illustrated in FIG. 21. This pattern of the insulating layer 30 has the functions of a hard mask film for trench formation.

Subsequently, the substrate 1A is etched by anisotropic dry etching using the insulating layer 30 pattern as an etching mask, as illustrated in FIG. 22. The trenches 5a, lead-out trenches 5b, and cutoff trenches 5c are thereby formed. The trenches 5a, lead-out trenches 5b, and cutoff trenches 5c are identical in depth. Subsequently, the insulating layer 30 is removed to expose the main surface of the substrate 1A (i.e., semiconductor wafer), as illustrated in FIG. 23. Then, the substrate 1A is subjected to thermal oxidation to form an insulating layer 6 composed of, for example, silicon oxide over the main surface of the substrate 1A, as illustrated in FIG. 24. (The main surface includes the inner surfaces of the trenches 5a, lead-out trenches 5b, and cutoff trenches 5c.) The thickness of the insulating layer 6 is, for example, 200 nm or so.

Subsequently, a conductor layer (first conductor layer) 7 is deposited over the insulating layer 6 over the main surface of the substrate 1A (i.e., semiconductor wafer) by CVD (Chemical Vapor Deposition), as illustrated in FIG. 25. (The main surface includes the inner surfaces of the trenches 5a, lead-out trenches 5b, and cutoff trenches 5c.) The conductor layer (first conductor layer) is composed of, for example, low-resistance polycrystalline silicon. Thus, the conductor layer 7 is buried in the trenches 5a, lead-out trenches 5b, and cutoff trenches 5c. The resistance of the conductor layer 7 has been lowered by implanting an impurity (e.g., phosphorus (P), boron (B), arsenic (As), or stibium (Sb)) that functions as dopant into silicon.

Subsequently, a resist pattern that covers the gate wiring GL1 formation regions (lead-out regions) is formed in the isolation regions of the substrate 1A by the above-mentioned photolithography. Then, part of the conductor layer 7 is etched. At this time, the conductor layer 7 is etched so that the following is implemented: as illustrated in FIG. 26, the conductor layer 7 is left to some mid level of the depth in the trenches 5a, lead-out trenches 5b, and cutoff trenches 5c. (The lead-out trenches 5b are the lead-out trenches 5b extended in the first direction Y in FIG. 2, that is, the lead-out regions: Refer to FIG. 7.) Thus, the conductor layer 7 left in the trenches 5a, lead-out trenches 5b, and cutoff trenches 5c makes the dummy gate electrodes 7E. (The lead-out trenches 5b are the lead-out trenches 5b, extended in the first direction Y, in the element formation regions in FIG. 2: Refer to FIG. 7.) The gate wirings GL1 are formed in the isolation regions. The dummy gate electrodes 7E and the gate wirings GL1 are integrally formed and electrically connected with each other. (Refer to FIG. 7.)

Subsequently, a resist pattern that covers the formation region for the insulating layer 6b for isolation is formed in the isolation regions of the substrate 1A by the above-mentioned photolithography. Then, using that resist pattern and the dummy gate electrodes 7E (conductor layer 7) as an etching mask, the insulating layer 6 exposed therefrom is etched. Further, the resist pattern that covers the insulating layer 6b formation region is removed. Thus, as illustrated in FIG. 27, the gate insulating layer 6a formed of the insulating layer 6 is formed in the trenches 5a, lead-out trenches 5b, and cutoff trenches 5c. At the same time, the insulating layer 6b for isolation formed of the insulating layer 6 is formed over the main surface of the substrate 1A in the isolation regions. In this process, the insulating layer 6b for isolation is formed of the same insulating layer 6 as of the gate insulating layer 6a. Thus, it is unnecessary to form the peripheral insulating layer 6b separately from the gate insulating layer 6a, and the number of processes can be reduced.

Subsequently, the substrate 1A (i.e., semiconductor wafer) is subjected to thermal oxidation. As illustrated in FIG. 28, the gate insulating layer 8 is thereby formed over the main surface of the substrate 1A. The main surface includes the side faces of the trenches 5a, lead-out trenches 5b (Refer to FIG. 7), and cutoff trenches 5c. At the same time, the insulating layer 10 is formed over the dummy gate electrodes 7E and the surfaces (exposed faces) of the gate wirings GL1. The gate insulating layer 8 and the insulating layer 10 are composed of, for example, silicon oxide, and are so formed that they are thinner than the above-mentioned gate insulating layer 6a. This is required for enhancing the current driving capability of the power MIS-FET and reducing its on-resistance. The thickness of the gate insulating layer 8 is, for example, 50 nm or so.

The gate insulating layer 8 and the insulating layer 10 may be formed as follows: first, the substrate 1A is subjected to thermal oxidation. An insulating layer is thereby formed over the side faces of the trenches 5a, lead-out trenches 5b, and cutoff trenches 5c and the upper faces of the dummy gate electrodes 7E. At this time, the following takes place because the polycrystalline silicon of the dummy gate electrodes 7E is higher in rate of oxidation than the silicon of the side faces of the trenches 5a, lead-out trenches 5b, and cutoff trenches 5c: the insulating layer thicker than the side faces of the trenches 5a, lead-out trenches 5b, and cutoff trenches 5c is formed over the dummy gate electrodes 7E. Subsequently, isotropic etching (wet etching by hydrofluoric acid (HF) or the like) is carried out. Thus, the insulating layer over the side faces of the trenches 5a, lead-out trenches 5b, and cutoff trenches 5c is removed, and further the insulating layer is left over the dummy gate electrodes 7E. Thereafter, with the insulating layer present over the dummy gate electrodes 7E and the side faces of the trenches 5a, lead-out trenches 5b, and cutoff trenches 5c exposed, thermal oxidation is carried out. As a result, the gate insulating layer 8 is formed over the side faces of the trenches 5a, lead-out trenches 5b, and cutoff trenches 5c. At the same time, the insulating layer 10 is formed over the dummy gate electrodes 7E.

Some products require a thick gate insulating layer. When a gate insulating layer is formed only by thermal oxidation in such a case, much silicon is oxidized. As a result, the widths of the trenches 5a and the like are widened, and the cell size is increased. When the amount of oxidation is increased, the shape of the shoulders of the trenches 5a and the like is sharpened. A sharp shape becomes a point of electric field concentration, and this causes increase in the leakage current of a gate, degradation in TDDB, and the like. In addition, similarly with the foregoing, the shape of the dummy gate electrodes 7E is sharpened, which can cause increase in leakage current or degradation in TDDB in the insulating layer 10 between a gate electrode 9E and a dummy gate electrode 7E. With respect to a product that requires a thick gate insulating film, CVD may be used to form the gate insulating layer 8 and the insulating layer 10 to cope with the foregoing.

As illustrated in FIG. 29, thereafter, a conductor layer (second conductor layer) 9, composed of, for example, low-resistance polycrystalline silicon, is deposited by CVD. This conductor layer (second conductor layer) is deposited over the gate insulating layer 8 and the insulating layer 10 over the main surface of the substrate 1A (i.e., semiconductor wafer). (The main surface includes the inner surfaces of the trenches 5a, lead-out trenches 5b, and cutoff trenches 5c.) Thus, the conductor layer 9 is buried at the upper parts of the interior of the trenches 5a, lead-out trenches 5b, and cutoff trenches 5c.

The conductor layer 9 has been lowered in resistance by implanting the same impurity as for the conductor layer 7.

Subsequently, a resist pattern that covers gate wiring GL2 formation regions (lead-out regions) is formed in the isolation regions of the substrate 1A by the above-mentioned photolithography. Then, the conductor layer 9 is etched back by anisotropic dry etching, and the resist pattern that covers the gate wiring GL2 formation regions is removed. As illustrated FIG. 30, the gate electrodes 9E are thereby formed in the trenches 5a and the lead-out trenches 5b (Refer to FIG. 7). At the same time, the gate electrodes 9E are formed in the cutoff trenches 5c to form the cutoff portions 19. The gate electrodes 9E are so formed that they are of recess structure, and their upper faces are recessed to a level lower than the main surface of the substrate 1A. In addition, the gate wirings GL2 are formed in the isolation regions by the above-mentioned etch back process. The gate electrodes 9E and the gate wirings GL2 are integrally formed and electrically connected with each other. (Refer to FIG. 7.)

Subsequently, a resist pattern that exposes channel formation regions is formed over the main surface of the substrate 1A by the above-mentioned photolithography. Then, an impurity, such as boron, is implanted into the main surface of the substrate 1A (i.e., semiconductor wafer) by ion implantation. At this time, that resist pattern and the above-mentioned gate wirings GL1 and GL2 and insulating layer 6b for isolation are used as a mask. Thereafter, the resist pattern that exposes the channel formation regions is removed, and the substrate 1A is subjected to thermal diffusion to form the semiconductor region 4 for channel formation, as illustrated in FIG. 31. Then the peripheral end of the semiconductor region 3 for channel formation is substantially defined by the end 6b1 of the insulating layer 6b. The influence of surface segregation on the semiconductor region 3 for channel formation during a gate oxidation (silicon oxidation) process can be eliminated by forming it after the gate oxidation process. Especially, in case of n channel-type power MIS-FET (boron is used as the impurity for channels), it is preferable that the semiconductor region 3 for channel formation should be formed after the gate oxidation process. This is because the impurity concentration is prone to fluctuate due to surface segregation.

Thereafter, a resist pattern that exposes source formation regions is formed over the main surface of the substrate 1A by the above-mentioned photolithography. Then, an impurity, such as phosphorus or arsenic, is implanted into the main surface of the substrate 1A (i.e., semiconductor wafer) by ion implantation. At this time, that resist pattern and the above-mentioned gate wirings GL1 and GL2 and insulating layer 6b for isolation are used as a mask. Thereafter, the resist pattern that exposes the source formation regions is removed, and the substrate 1A is subjected to thermal diffusion to form the semiconductor regions 3 for source, as illustrated in FIG. 32. The semiconductor regions 3 for source are so formed that the cutoff portions 19 are disposed between their peripheral ends and the end 6b1 of the insulating layer 6b for isolation.

As illustrated in FIG. 33, subsequently, the interlayer insulating layer 12 composed of, for example, silicon oxide is deposited over the main surface of the substrate 1A (i.e., semiconductor wafer). Then, a resist pattern that exposes contact hole formation regions is formed over the interlayer insulating layer 12 by the above-mentioned photolithography. Subsequently, the interlayer insulating layer 12 is etched using as an etching mask the resist pattern that exposes the contact hole formation regions, and then the resist pattern is removed. The contact holes 15 are thereby formed in the interlayer insulating layer 12, as illustrated in FIG. 34. Thereafter, using the contact holes 15 as an etching mask, part of the substrate 1A (the upper face of the epitaxial layer 1EP) exposed therein is etched to form the trenches 16, as illustrated in FIG. 35. The trenches 16 penetrate the semiconductor regions 3 for source and are terminated at the semiconductor region 4 for channel formation. In this stage, the outer circumference of the trenches 16 and the inner circumference of the contact holes 15 are identical with each other in planar position. Thereafter, an impurity, such as boron, is implanted into the bottom of the trenches 16 by ion implantation or the like to form the p-type semiconductor regions 17.

Subsequently, the interlayer insulating layer 12 is isotropically etched to back off the side faces of the contact holes 15 in the interlayer insulating layer 12 in the direction in which they recede away from the trenches 16. Thus, the contact holes 15a and 15c whose side faces are in forward tapered shape are formed in the interlayer insulating layer 12, as illustrated in FIG. 36. As a result, the relation expressed as $0 \leq b \leq a$ holds as illustrated in FIG. 5 and FIG. 6, where a is the distance between an end (position P1) of the interlayer insulating layer 12 over the upper faces of the semiconductor regions 3 for source and the ends (position P2) of the upper faces of the semiconductor regions 3 for source farther from the gate electrodes 9E; and b is the length of the overlap between the interlayer insulating layer 12 and the upper faces of the semiconductor regions 3 for source.

Up to this point, concrete description has been given to the invention made by the present inventors based on its embodiments. However, the present invention is not limited to the above-mentioned embodiments, and various modifications can be made without departing from its spirit, needless to add.

Some examples will be taken. With respect to the first to third embodiments, description is given to a case where the disposition of the gate electrodes is of stripe type. However, the disposition is not limited to this, and the gate electrodes may be disposed in a reticular pattern or in a mesh pattern. That it, the disposition of the gate electrodes may be of so-called mesh type. Adoption of the mesh-type disposition enhances the gate density, and thus the on-resistance can be further reduced. In addition, the gate resistance can be reduced, and thus the switching loss can also be reduced. In this case, it is unnecessary to provide the cutoff portions 19 described in relation to the first and second embodiments. However, it is required to dispose the outermost trenches 5a between the ends (position P4) of the semiconductor regions 3 for source and the end 6b1 of the insulating layer 6b for isolation as described with respect to the second embodiment.

The above description has been made to cases where the invention made by the present inventors is applied to a power supply circuit for driving CPU or DSP, which is a field of utilization as a background to the invention. The present invention is not limited to this application and can be applied to various fields. For example, the present invention can be applied to a power supply circuit for driving any other circuit.

The present invention is applicable to the manufacture of a semiconductor device having a power transistor with a trench gate structure.

What is claimed is:
1. A semiconductor device having a field-effect transistor with a trench gate structure on a semiconductor substrate, the semiconductor substrate having a first main surface and a second main surface on the reverse side thereof,
the field-effect transistor with a trench gate structure comprising:
a source region of first conductivity type, provided on the first main surface of the semiconductor substrate;

a drain region of the first conductivity type, provided on the second main surface of the semiconductor substrate;

a channel forming region provided between the source region and the drain region of the semiconductor substrate;

a first trench that extends in a direction orthogonal to the first main surface of the semiconductor substrate so that the first trench extends from the first main surface of the semiconductor substrate, penetrates the source region and the channel forming region, and is terminated at the drain region;

a gate insulating layer formed in the first trench;

a gate electrode provided in the first trench via the gate insulating layer;

an interlayer insulating layer provided over the gate electrode; and a source electrode that is provided over the first main surface of the semiconductor substrate with the interlayer insulating layer in-between, and is brought into contact with and electrically connected with the upper face of the source region, exposed from the interlayer insulating layer, wherein the upper face of the gate electrode is formed at a level lower than the first main surface of the semiconductor substrate, wherein the first main surface of the semiconductor substrate is formed with a second trench which extends in a direction orthogonal to the first main surface of the semiconductor substrate so that the second trench extends from the upper face of the source region, exposed from the interlayer insulating layer, wherein the second trench penetrates the source region, and is terminated at the channel forming region, wherein, letting the distance, wherein the upper face of the source region is exposed from the interlayer insulating film, between an end of the interlayer insulating layer over the upper face of the source region and an edge of the second trench, adjacent to said end of the interlayer insulating layer, be "a" and letting the length of the overlap between the interlayer insulating layer and the upper face of the source region be "b", b≦a, wherein the source electrode is formed in the second trench; and wherein the source electrode is brought into contact with and electrically connected with the source region and the channel forming region through the second trench.

2. The semiconductor device according to claim 1, wherein the length b of the overlap between the interlayer insulating layer and the upper face of the source region is equal to or greater than 0.

3. The semiconductor device according to claim 1, wherein an electrode is provided in the first trench via a first insulating layer, wherein the gate electrode is formed above the electrode, and wherein a second insulating layer is formed between the electrode and the gate electrode, and the electrode and the gate electrode are insulated from each other.

4. The semiconductor device according to claim 3, wherein the electrode is electrically connected with source potential.

5. The semiconductor device according to claim 1, wherein a plurality of the first trenches and a plurality of the gate electrodes are provided in the first main surface of the semiconductor substrate, and the adjoining pitch of adjoining gate electrodes is 1.0 μm or less.

6. The semiconductor device according to claim 1, wherein the field-effect transistor with a trench gate structure is an n channel-type field-effect transistor.

7. A semiconductor device having a field-effect transistor with a trench gate structure on a semiconductor substrate, the semiconductor substrate having a first main surface and a second main surface on the reverse side thereof, the field-effect transistor with a trench gate structure comprising:

a source region of first conductivity type, provided on the first main surface of the semiconductor substrate;

a drain region of the first conductivity type, provided on the second main surface of the semiconductor substrate;

a channel forming region provided between the source region and the drain region of the semiconductor substrate;

a first trench which extends in a direction orthogonal to the first main surface of the semiconductor substrate so that the first trench extends from the first main surface of the semiconductor substrate, penetrates the source region and the channel forming region, and is terminated at the drain region;

a gate insulating layer formed in the first trench;

a gate electrode provided in the first trench via the gate insulating layer;

an interlayer insulating layer that is provided over the gate electrode; and a source electrode that is provided over the first main surface of the semiconductor substrate with the interlayer insulating layer in-between, and is brought into contact with and electrically connected with the upper face of the source region, exposed from the interlayer insulating layer, wherein a cutoff trench is provided between an end of the source region on the periphery of a group of a plurality of cells of the field-effect transistor with a trench gate structure and an end of an insulating layer for isolation provided outside the end of the source region on the periphery of the group of a plurality of the cells, wherein the first main surface of the semiconductor substrate is formed with a second trench which extends in a direction orthogonal to the first main surface of the semiconductor substrate so that the second trench extends from the upper face of the source region, exposed from the interlayer insulating layer, wherein the second trench penetrates the source region, and is terminated at the channel forming region, wherein, letting the distance, wherein the upper face of the source region is exposed from the interlayer insulating film, between an end of the interlayer insulating layer over the upper face of the source region and an edge of the second trench, adjacent to said end of the interlayer insulating layer, be "a" and letting the length of the overlap between the interlayer insulating layer and the upper face of the source region be "b", b≦a, wherein the source electrode is formed in the second trench, and wherein the source electrode is brought into contact with and electrically connected with the source region and the channel forming region through the second trench.

8. The semiconductor device according to claim 7, wherein the cutoff trench is so provided that the cutoff trench intersects the first trench in the field-effect transistor with a trench gate structure.

9. The semiconductor device according to claim 7, wherein the first trench in the field-effect transistor with a trench gate structure is so formed that the first trench extends in a first direction along the first main surface of the semiconductor substrate, and wherein a plurality of the first trenches which extend in the first direction are disposed side by side in a second direction orthogonal to the first direction.

10. The semiconductor device according to claim 9, wherein the cutoff trench is provided at both ends of a plurality of the first trenches in the first direction so that the cutoff trenches intersect the first trenches.

11. The semiconductor device according to claim 7, wherein an electrode is provided in the first trenches via a first insulating layer, wherein the gate electrode is formed above the electrode, and wherein a second insulating layer is formed between the electrode and the gate electrode, and the electrode and the gate electrode are insulated from each other.

12. The semiconductor device according to claim 11, wherein the electrode is electrically connected with source potential.

13. The semiconductor device according to claim 11, wherein the first insulating layer is thicker than the gate insulating layer.

14. The semiconductor device according to claim 11, wherein the first insulating layer and the insulating layer for isolation are comprised of an insulating layer formed in one and the same process.

15. The semiconductor device according to claim 1, wherein a third insulating film is disposed between the interlayer insulating layer and the gate electrode.

16. The semiconductor device according to claim 11, wherein a third insulating film is disposed between the interlayer insulating layer and the gate electrode.

* * * * *